United States Patent
Oh et al.

(10) Patent No.: US 11,488,928 B2
(45) Date of Patent: Nov. 1, 2022

(54) BALL DISPOSITION SYSTEM, METHOD OF DISPOSING A BALL ON A SUBSTRATE AND METHOD OF MANUFACTURING SEMICONDUCTOR DEVICE

(71) Applicant: Samsung Electronics Co., Ltd., Suwon-si (KR)

(72) Inventors: Sukmin Oh, Asan-si (KR); Howon Seo, Cheonan-si (KR); Heeju Seo, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 136 days.

(21) Appl. No.: 17/028,789

(22) Filed: Sep. 22, 2020

(65) Prior Publication Data

US 2021/0249378 A1 Aug. 12, 2021

(30) Foreign Application Priority Data

Feb. 7, 2020 (KR) .................. 10-2020-0014894

(51) Int. Cl.
*B23K 3/00* (2006.01)
*H01L 23/00* (2006.01)
(Continued)

(52) U.S. Cl.
CPC ............ *H01L 24/75* (2013.01); *B23K 1/0016* (2013.01); *B23K 3/0623* (2013.01); *B23K 3/08* (2013.01);
(Continued)

(58) Field of Classification Search
CPC .............. H01L 24/75; H01L 24/11; H01L 2224/11318; H01L 2224/117; H01L 2224/75611; H01L 2224/75745; H01L 2224/75756; H01L 2224/759; H01L 21/4853; H01L 24/742; H01L 2224/11334; H01L 2224/11849; H01L 2224/81024; H01L 2224/81192; H01L 21/67144; H01L 21/561; H01L 24/10; H01L 23/49816;
(Continued)

(56) References Cited

U.S. PATENT DOCUMENTS

| | | | | |
|---|---|---|---|---|
| 5,547,537 A | * | 8/1996 | Reynolds .......... | H01L 21/67144 156/538 |
| 5,655,704 A | * | 8/1997 | Sakemi ............... | H05K 3/3478 228/41 |

(Continued)

FOREIGN PATENT DOCUMENTS

| | | | | | |
|---|---|---|---|---|---|
| JP | 04065130 A | * | 3/1992 | | |
| JP | 05129374 A | * | 5/1993 | ......... | H01L 21/4853 |

(Continued)

OTHER PUBLICATIONS

Machine translation of JP2003100789A (no date available).*

*Primary Examiner* — Kiley S Stoner
(74) *Attorney, Agent, or Firm* — Muir Patent Law, PLLC

(57) ABSTRACT

A ball disposition system includes a ball adsorption device, and a ball guide plate providing a ball guide hole. The ball adsorption device includes an adsorption plate providing an adsorption hole extending in a first direction, and a pin extending in the first direction, a portion of the pin inserted in the adsorption hole. The ball guide plate is located beyond the adsorption plate in the first direction.

18 Claims, 20 Drawing Sheets

(51) Int. Cl.
    *B23K 1/00*     (2006.01)
    *B23K 3/06*     (2006.01)
    *B23K 3/08*     (2006.01)
    *B23K 101/42*     (2006.01)
    *B23K 101/40*     (2006.01)

(52) U.S. Cl.
    CPC .......... *H01L 24/11* (2013.01); *B23K 2101/40* (2018.08); *B23K 2101/42* (2018.08); *H01L 2224/117* (2013.01); *H01L 2224/11318* (2013.01); *H01L 2224/759* (2013.01); *H01L 2224/75611* (2013.01); *H01L 2224/75745* (2013.01); *H01L 2224/75756* (2013.01)

(58) Field of Classification Search
    CPC ......... H01L 23/50; H01L 24/13; H01L 24/16; B23K 1/0016; B23K 3/0623; B23K 3/08; B23K 2101/40; B23K 2101/42; B23K 35/0244; H05K 1/181
    USPC .................. 228/180.22, 245–246, 33, 41
    See application file for complete search history.

(56) References Cited

U.S. PATENT DOCUMENTS

| | | | |
|---|---|---|---|
| 6,268,275 B1 * | 7/2001 | Cobbley | H01L 21/6835 438/615 |
| 6,352,189 B1 * | 3/2002 | Kobayashi | B23K 3/0623 228/8 |
| 6,412,685 B2 * | 7/2002 | Hertz | B23K 3/0623 228/41 |
| 6,460,755 B1 * | 10/2002 | Inoue | B23K 3/0623 228/41 |
| 6,533,159 B1 * | 3/2003 | Cobbley | B23K 3/0623 228/41 |
| 6,533,160 B1 * | 3/2003 | Bourrieres | H05K 3/3478 228/41 |
| 6,766,938 B2 | 7/2004 | Cheng et al. | |
| 6,844,216 B2 | 1/2005 | Cobbley et al. | |
| 7,506,792 B1 * | 3/2009 | Manfroy | B23K 3/082 228/41 |
| 7,597,233 B2 | 10/2009 | Sakaguchi et al. | |
| 8,012,866 B2 | 9/2011 | Tu et al. | |
| 2001/0007330 A1 * | 7/2001 | Kajii | B23K 3/0623 228/103 |
| 2001/0008249 A1 * | 7/2001 | Hertz | B23K 3/0623 29/842 |
| 2001/0015372 A1 * | 8/2001 | Yamamoto | B23K 3/0623 228/41 |
| 2002/0053591 A1 * | 5/2002 | Razon | B23K 3/0623 228/258 |
| 2002/0058406 A1 * | 5/2002 | Mukuno | H01L 21/4853 438/626 |
| 2002/0135064 A1 * | 9/2002 | Hazeyama | H01L 24/11 257/737 |
| 2002/0166886 A1 * | 11/2002 | Inoue | H01L 24/11 228/245 |
| 2003/0042287 A1 * | 3/2003 | Inoue | H05K 3/3478 228/49.5 |
| 2003/0127501 A1 * | 7/2003 | Cheng | H01L 21/4853 228/246 |
| 2005/0045701 A1 * | 3/2005 | Shindo | B23K 3/0623 228/41 |
| 2006/0134903 A1 * | 6/2006 | Boufnichel | H01L 24/11 257/E23.021 |
| 2010/0257727 A1 * | 10/2010 | Hiraki | H01L 21/67144 29/729 |
| 2011/0036897 A1 * | 2/2011 | Nakai | H01L 24/81 228/1.1 |
| 2011/0107580 A1 * | 5/2011 | Ishikawa | H01L 24/742 29/283 |
| 2014/0263589 A1 * | 9/2014 | Igarashi | B23K 1/0016 228/248.1 |
| 2014/0339291 A1 * | 11/2014 | Chen | B23K 3/0623 228/248.1 |
| 2015/0122873 A1 * | 5/2015 | Lee | B23K 1/203 228/41 |
| 2015/0231723 A1 * | 8/2015 | An | B23K 1/0016 228/41 |
| 2015/0328707 A1 * | 11/2015 | Kim | H05K 3/34 228/41 |
| 2016/0016247 A1 * | 1/2016 | An | B23K 3/0623 228/41 |
| 2020/0105553 A1 * | 4/2020 | Kim | H01L 21/67138 |
| 2020/0108459 A1 * | 4/2020 | Lee | H01L 24/11 |
| 2020/0132438 A1 * | 4/2020 | Hayata | H01L 24/75 |

FOREIGN PATENT DOCUMENTS

| | | | | |
|---|---|---|---|---|
| JP | 10335802 A | * | 12/1998 | .......... B23K 3/0623 |
| JP | 2003100789 A | * | 4/2003 | |
| KR | 10-2005-0020375 A | | 3/2005 | |
| KR | 10-0549301 B1 | | 2/2006 | |
| KR | 10-0779454 B1 | | 11/2007 | |
| KR | 10-1293452 B1 | | 8/2013 | |
| KR | 10-1416650 B1 | | 7/2014 | |
| KR | 10-1574124 B1 | | 12/2015 | |
| WO | WO-9809323 A1 | * | 3/1998 | ......... H01L 21/6835 |
| WO | WO-9836451 A1 | * | 8/1998 | .......... B23K 3/0623 |

* cited by examiner

BALL DISPOSITION SYSTEM, METHOD OF DISPOSING A BALL ON A SUBSTRATE AND METHOD OF MANUFACTURING SEMICONDUCTOR DEVICE

CROSS-REFERENCE TO RELATED APPLICATION

This U.S. non-provisional patent application claims priority under 35 U.S.C. § 119 to Korean Patent Application No. 10-2020-0014894, filed on Feb. 7, 2020, in the Korean Intellectual Property Office, the disclosure of which is hereby incorporated by reference in its entirety.

BACKGROUND

Embodiments of the inventive concepts relate to a ball disposition system and a method for disposing a ball on a substrate, and more particularly, to a ball disposition system including a guide member and a method for disposing a ball on a substrate. The disclosure also relates to a method of manufacturing semiconductor devices using the ball disposition system.

An integrated circuit chip may be realized in the form of a semiconductor package so as to be appropriately applied to an electronic product. Typically, a semiconductor chip may be mounted on a substrate such as a printed circuit board (PCB), thereby forming the semiconductor package. A solder ball may be used to electrically connect a circuit in the substrate to an external device or system. The solder ball may be electrically connected to an exposed pad formed on a surface of the substrate. Recently, high-performance, high-speed and small electronic components have been increasingly demanded with the development of the electronic industry. Due to this trend, sizes of the solder balls have been reduced.

SUMMARY

Embodiments of the inventive concepts may provide a ball disposition system and a method for disposing a ball on a substrate, which are capable of accurately placing the ball on the substrate.

Embodiments of the inventive concepts may also provide a ball disposition system and a method for disposing a ball on a substrate, which are capable of preventing a ball adsorption device from being contaminated when the ball is placed.

Embodiments of the inventive concepts may also provide a ball disposition system and a method for disposing a ball on a substrate, which are capable of easily replacing and/or cleaning a component when the component is contaminated.

Embodiments of the inventive concepts may also provide a ball disposition system and a method for disposing a ball on a substrate, which are capable of placing the ball on a center of a pad of the substrate by dropping the ball straight when the ball drops from a ball adsorption device to the substrate.

In an aspect, a ball disposition system may include a ball adsorption device, and a ball guide plate providing a ball guide hole. The ball adsorption device may include an adsorption plate providing an adsorption hole extending in a first direction, and a pin extending in the first direction, a portion of the pin inserted in the adsorption hole. The ball guide plate may be located beyond the adsorption plate in the first direction.

In an aspect, a ball disposition system may include a ball adsorption device configured to adsorb a ball, a stage configured to receive a substrate, and a ball guide. The ball adsorption device may include an adsorption plate providing an adsorption hole configured to adsorb a ball. The ball guide may include a ball guide plate providing a ball guide hole configured to guide a dropping path of a ball. The ball guide plate may be configured to be disposed between the adsorption plate and the stage.

In an aspect, a method for disposing a ball on a substrate may include adsorbing a ball to a ball adsorption device, aligning the ball adsorption device, a ball guide plate and a substrate with each other, and disposing the ball on the substrate. The substrate may be disposed on a stage. The ball adsorption device may include an adsorption plate providing an adsorption hole to which the ball is adsorbed. The ball guide plate may provide a ball guide hole for guiding a dropping path of the ball. The ball guide plate may be disposed between the adsorption plate and the stage.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
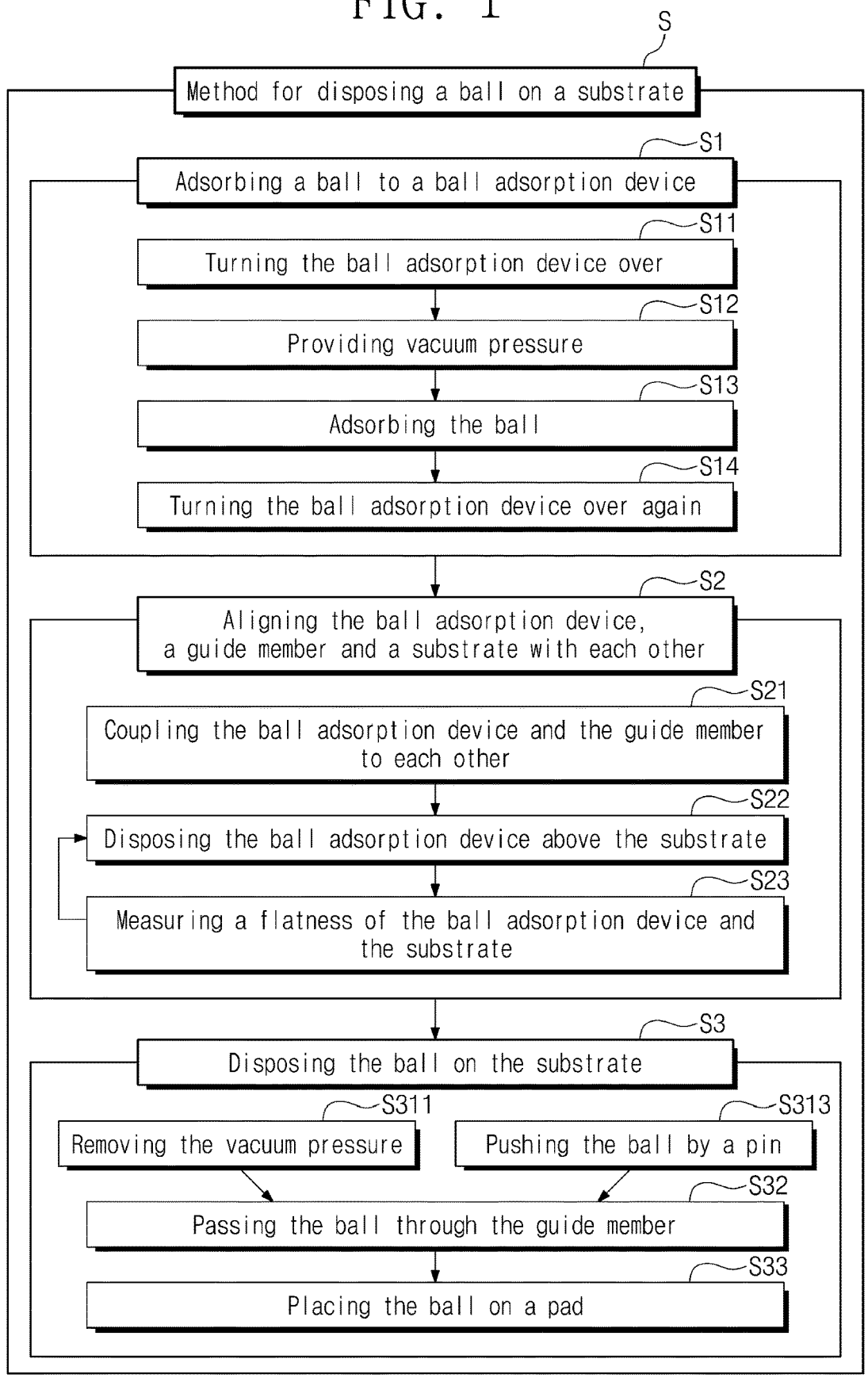
FIG. 1 is a flowchart illustrating a method for disposing a ball on a substrate, according to some embodiments of the inventive concepts.

Hereinafter, embodiments of the inventive concepts will be described in detail with reference to the accompanying drawings. The same reference numerals or the same reference designators may denote the same elements or components throughout the specification.

A substrate may include an internal circuit and a pad for connecting the internal circuit to an external device or system. A ball may be used to electrically connect the internal circuit of the substrate to the external device or system. The ball may be bonded to the substrate.

The bonding of the ball to the substrate may include loading the substrate, applying a flux onto the pad, disposing the ball on the substrate, heating the substrate on which the ball is disposed, performing a cleaning process, and unloading the substrate.

The loading of the substrate may include disposing the substrate on a stage. In some embodiments, the loading of the substrate may be performed by a loader.

The applying of the flux onto the pad may include applying the flux onto the pad exposed to the outside on a surface of the substrate. The applying of the flux onto the pad may be performed before the ball is disposed on the pad of the substrate.

The ball may be disposed on the substrate after the flux is applied onto the pad. The ball may be disposed on the pad on which the flux is applied. Hereinafter, the disposing of the ball on the substrate will be described in detail with reference to FIGS. 1 to 12.

FIG. 1 is a flowchart illustrating a method for disposing a ball on a substrate, according to some embodiments of the inventive concepts.

Referring to FIG. 1, a method S for disposing a ball on a substrate will be described. The method S for disposing the ball on the substrate may include adsorbing a ball to a ball adsorption device (S1), aligning the ball adsorption device, a guide member and a substrate with each other (S2), and disposing the ball on the substrate (S3).

In some embodiments, the adsorbing of the ball to the ball adsorption device (S1) may include turning the ball adsorption device over (S11), providing vacuum pressure (S12), adsorbing the ball (S13), and turning the ball adsorption device over again (S14).

The aligning of the ball adsorption device, the guide member and the substrate with each other (S2) may include coupling the ball adsorption device and the guide member to each other (S21), disposing the ball adsorption device above the substrate (S22), and measuring a flatness of the ball adsorption device and the substrate (S23).

The disposing of the ball on the substrate (S3) may include removing the vacuum pressure (S311), pushing the ball by a pin (S313), passing the ball through the guide member (S32), and placing the ball on a pad (S33). The guide member (e.g., 31) described herein may be a ball guide plate, or ball guide member, including a plurality of holes through which balls are guided while passing through the holes.

Hereinafter, the steps of the method S for disposing the ball on the substrate will be described in more detail with reference to FIGS. 2 to 12.

Figure 2:
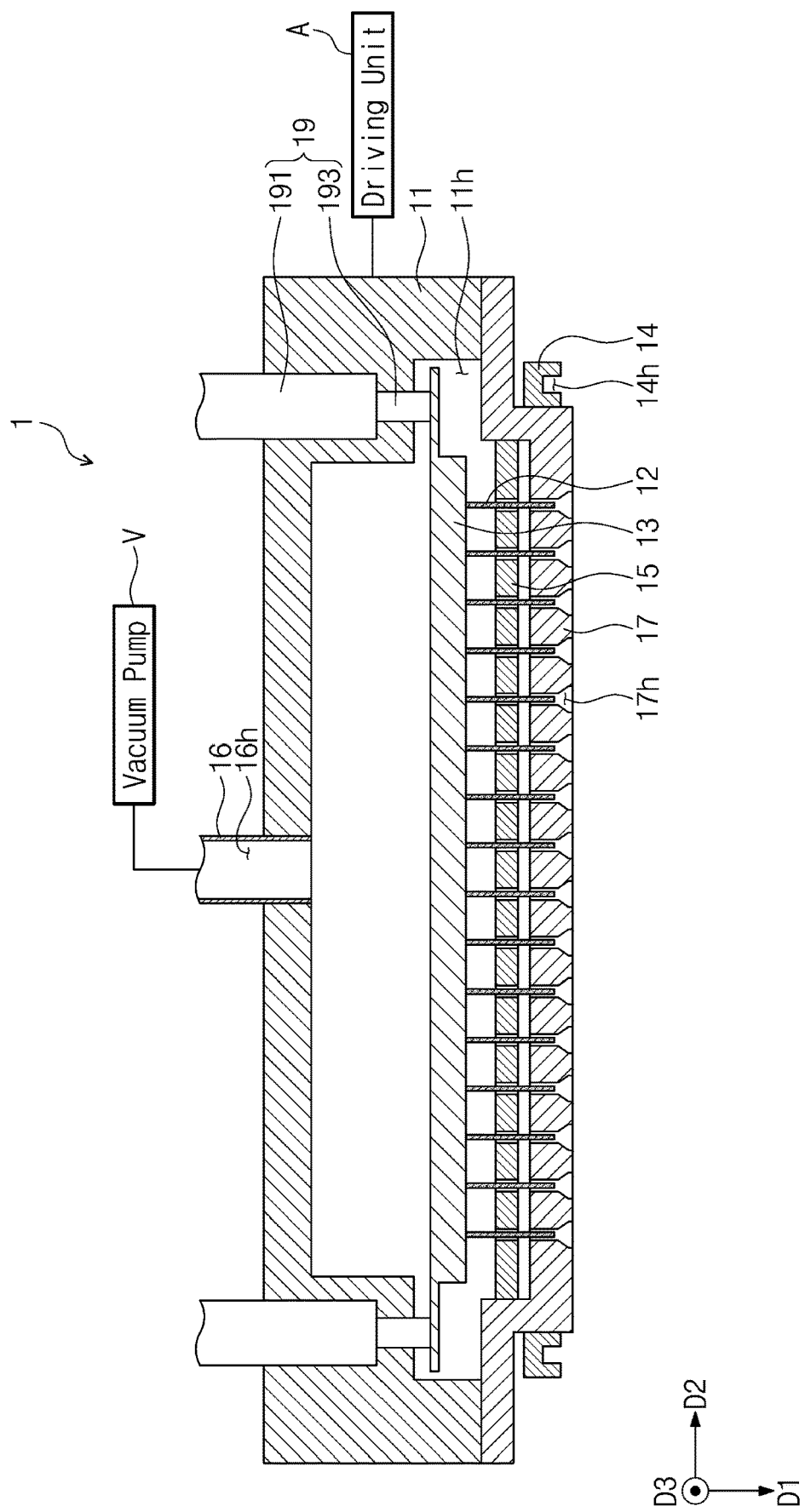
FIG. 2 is a cross-sectional view illustrating a ball adsorption device according to some embodiments of the inventive concepts.

FIG. 2 is a cross-sectional view illustrating a ball adsorption device according to some embodiments of the inventive concepts.

In FIG. 2, a reference designator 'D1' may be referred to as a first direction, a reference designator 'D2' perpendicular to the first direction D1 may be referred to as a second direction, and a reference designator 'D3' perpendicular to the first and second directions D1 and D2 may be referred to as a third direction.

Figure 3:
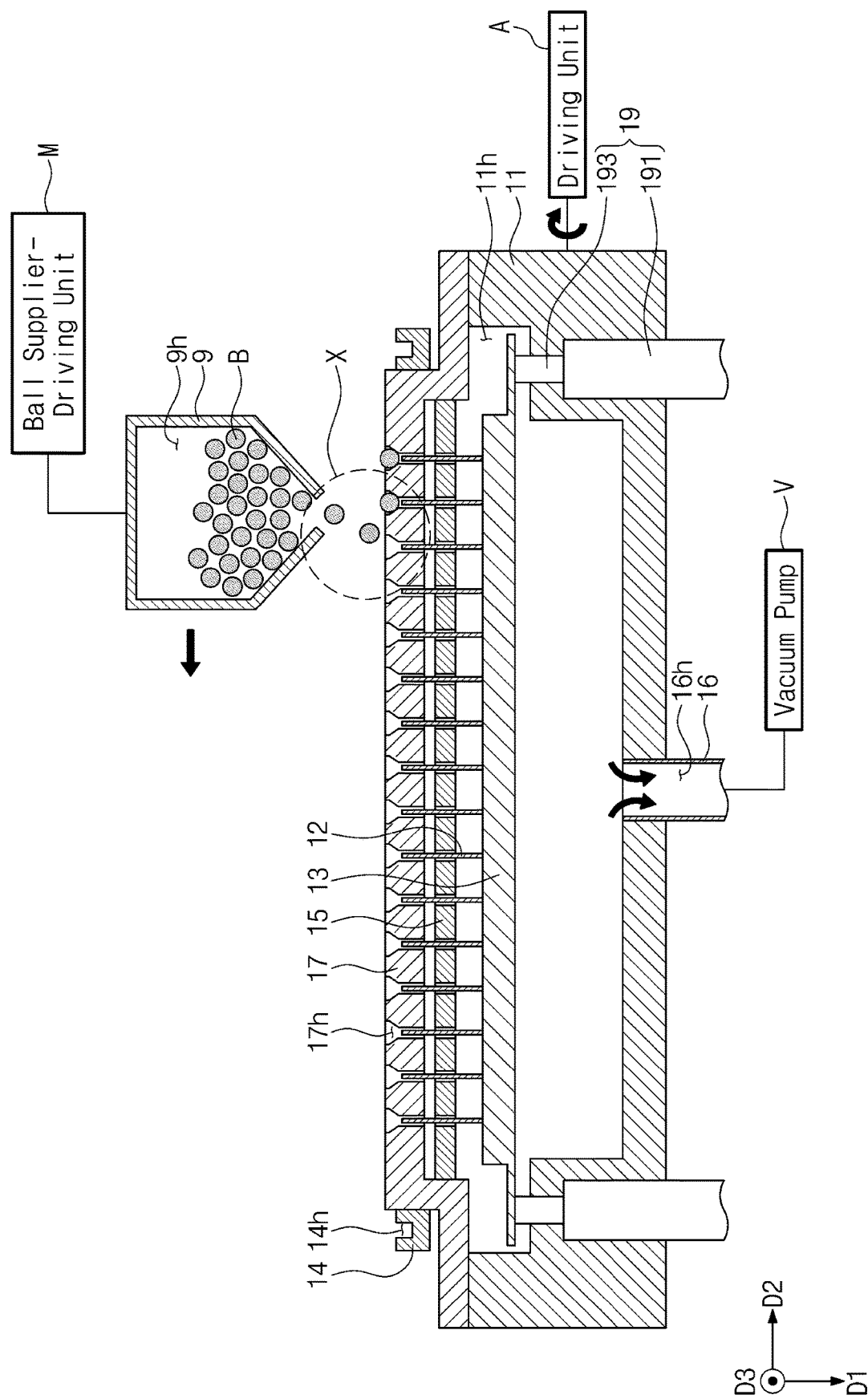
FIG. 3 is a cross-sectional view illustrating a process in which a ball is adsorbed to a ball adsorption device according to some embodiments of the inventive concepts.

Referring to FIG. 2, a ball disposition system according to some embodiments of the inventive concepts may include a ball adsorption device 1, a vacuum pump V, a driving unit A, a guide unit 3 (see FIG. 5), a stage 5 (see FIG. 7), an observation unit 7 (see FIG. 8), and a ball supplier 9 (see FIG. 3).

The ball adsorption device 1 may adsorb a ball. The ball adsorption device 1 may be connected to the vacuum pump V and the driving unit A. The ball adsorption device 1 may be provided with vacuum pressure from the vacuum pump V, e.g., during an operation. For example, an adsorption hole 17h of the ball adsorption device 1 may be provided with the vacuum pressure from the vacuum pump V, e.g., during an operation. The ball adsorption device 1 may be moved by the driving unit A. For example, the ball adsorption device 1 may be rotated and/or horizontally moved by power provided from the driving unit A. For example, the driving unit A may be a ball adsorption device driver providing power/mechanism for the ball adsorption device 1 to move, rotate and/or operate. These features will be described later in more detail. In some embodiments, the ball adsorption device 1 may include a body 11, a pin 12, a fixing plate 13, a coupling member 14, an intermediate plate 15, a vacuum pressure-providing pipe 16, an adsorption plate 17, and a pin-driving unit 19.

The body 11 may couple other components of the ball adsorption device 1 to each other. The body 11 may provide an inner space 11h e.g., enclosed by the body 11 and adsorption plate 17. The fixing plate 13 may be located in the inner space 11h. The fixing plate 13 may be movable in the first direction D1 and/or a direction opposite to the first direction D1 in the inner space 11h. For example, the fixing plate 13 may perform a reciprocation motion during an operation. The inner space 11h may be connected to the vacuum pressure-providing pipe 16. The inner space 11h may be connected to the vacuum pump V through the vacuum pressure-providing pipe 16. The vacuum pressure may be provided into the inner space 11h by the vacuum pump V. The inner space 11h may be connected to the adsorption hole 17h. When the vacuum pressure is provided in the inner space 11h, the vacuum pressure may also be provided into the adsorption hole 17h.

The pin 12 may be connected to the fixing plate 13. In some embodiments, the pin 12 may be coupled to a bottom surface of the fixing plate 13. The fixing plate 13 and/or similar components as described herein may be a pin hold plate holding one or more pins 12 at the bottom of the fixing plate 13. For example, one or more pins 12 may be attached at the bottom surface of the pin hold plate. The pin 12 may extend in the first direction D1. For example, the pin 12 may extend from the fixing plate 13 in the first direction D1. In some embodiments, the pin 12 may include a metallic material. A portion of the pin 12 may be inserted in the adsorption hole 17h. The pin 12 may be movable in the first direction D1. For example, the pin 12 may perform a reciprocation motion along with the fixing plate 13 during an operation. The pin 12 may push a ball B adsorbed on the adsorption hole 17h (see FIG. 12). When a diameter of the ball B is small, e.g., the same as or smaller than a diameter of the adsorption hole 17h, the ball B may be attached to the adsorption plate 17 even though the vacuum pressure is removed. Thus, the pin 12 may push the ball B to drop the ball B. A movement distance of the pin 12 may be changed depending on a size of the ball B. For example, a stroke/reciprocation distance of the pin 12 may be about 40% of the diameter of the ball B. However, embodiments of the inventive concepts are not limited thereto. The ball adsorption device 1 may include a plurality of pins 12. The plurality of pins 12 may be spaced apart from each other in the second direction D2 and/or the third direction D3.

The fixing plate 13 may be located in the inner space 11h of the body 11. The fixing plate 13 may have a plate shape extending in the second direction D2 and/or the third direction D3. The pin 12 may be coupled to the fixing plate 13. The pin 12 may be fixed to the fixing plate 13. The fixing plate 13 may be connected to the pin-driving unit 19. The fixing plate 13 may be movable in the first direction D1 and the direction opposite to the first direction D1 in the inner space 11h. For example, the fixing plate 13 may be moved up and down by the pin-driving unit 19. For example, the pin-driving unit 9 may be a pin hold plate driver or a fixing plate driver providing power/mechanism for the fixing plate 13 and the pins to move/operate. For example, the fixing plate 13 may be disposed on an opposite side of the adsorption plate 17 as the guide member 31, and is movable toward the adsorption plate 17. For example the fixing plate 13 and the guide member 31 may be disposed opposite sides with respect to the adsorption plate 17.

The coupling member 14 may be exposed to the outside. For example, the coupling member 14 may be located outside the body 11, not in the inner space 11h of the body 11. One or more coupling members 14 may be provided and coupled to at least one of various positions of the ball disposition system. For example, the coupling member 14 may be coupled to the adsorption plate 17. For example, the coupling member 14 may be coupled to a sidewall of the adsorption plate 17. For example, the coupling members 14 may be attached to a sidewall of the adsorption plate 17. The coupling member 14 may also be coupled to the guide unit 3 (see FIG. 5). For example, the coupling members 14 may be couplers coupling the adsorption plate 17 and the guide member 31 via the coupling members 14 and support members 33 described below. For example, the guide unit 3 may include a plurality of support members respectively corresponding to the coupling members 14. For example, the coupling members 14 may be latches mechanically and/or magnetically latch the coupling members 14 and the support members 33. In certain embodiments, the coupling members 14 may be grooves. The guide unit 3 may be fixed to the ball adsorption device 1 through the coupling member 14. The coupling member 14 may have one of various shapes for the coupling with the guide unit 3. For example, the coupling member 14 may have a shape of which a central portion of a bottom surface is recessed upward. In some embodiments, the coupling member 14 may include a coupling magnet. The coupling member 14 may be coupled to the guide unit 3 by magnetic coupling of the coupling magnet. The guide unit 3 as described herein may be a ball guide configured to control ball providing directions and including the guide member 31 and a plurality of support members 33.

The intermediate plate 15 may be located under the fixing plate 13. For example, the intermediate plate 15 may be spaced apart from the fixing plate 13 in the first direction D1. The intermediate plate 15 may be located between the fixing plate 13 and the adsorption plate 17. The intermediate plate 15 may have a plate shape extending in the second direction D2 and/or the third direction D3. The intermediate plate 15 may provide an intermediate hole 15h (see FIG. 10). The intermediate hole 15h may extend in the first direction D1. The pin 12 may be inserted in the intermediate hole 15h. A plurality of intermediate holes 15h may be provided in the intermediate plate 15. For example, the number of the intermediate holes 15h may be equal to the number of the pins 12. The plurality of intermediate holes 15h may be spaced apart from each other in the second direction D2 and/or the third direction D3. A position of the pin 12 inserted in the intermediate hole 15h may be guided by an inner surface of the intermediate hole 15h.

The vacuum pressure-providing pipe 16 may be coupled to the body 11. In some embodiments, the vacuum pressure-providing pipe 16 may extend in the first direction D1. The vacuum pressure-providing pipe 16 may penetrate an upper portion of the body 11. A flow path 16h of the vacuum pressure-providing pipe 16 may be connected to the inner space 11h. The flow path 16h may be connected to the vacuum pump V. The flow path 16h may connect the vacuum pump V to the inner space 11h of the body 11. The vacuum pressure may be provided from the vacuum pump V into the inner space 11h through the flow path 16h.

The adsorption plate 17 may be coupled to a lower portion of the body 11. The adsorption plate 17 may extend in the second direction D2 and/or the third direction D3. The adsorption plate 17 may have the adsorption hole 17h. The adsorption hole 17h may extend in the first direction D1. The ball B (see FIG. 4) may be adsorbed to the adsorption plate 17. The ball B may be adsorbed to a bottom end of the adsorption hole 17h. For example, the adsorption hole 17h may be a ball adsorption plate having ball adsorption holes. For example, the adsorption hole 17h may be a ball adsorption hole. A portion of the pin 12 may be inserted in the adsorption hole 17h. The adsorption hole 17h may be located under the intermediate hole 15h (see FIG. 10). This will be described later in more detail. A plurality of adsorption holes 17h may be provided in the adsorption plate 17. The number of the adsorption holes 17h may be equal to the number of the pins 12 and/or the number of the intermediate holes 15h (see FIG. 10). The plurality of adsorption holes 17h may be spaced apart from each other in the second direction D2 and/or the third direction D3.

The pin-driving unit 19 may be coupled to the body 11. The pin-driving unit 19 may extend in the first direction D1. The pin-driving unit 19 may move the pin 12. For example, the pin-driving unit 19 may move the fixing plate 13 to move the pin 12. The pin-driving unit 19 may include a movement shaft 193 and a driving member 191. The movement shaft 193 may extend in the first direction D1. The movement shaft 193 may be coupled to the fixing plate 13. The movement shaft 193 may move in the first direction D1. Thus, the fixing plate 13 may also move in the first direction D1. The driving member 191 may move the movement shaft 193 in the first direction D1. The driving member 191 may include at least one of various components capable of moving the movement shaft 193. For example, the driving member 191 may include a hydraulic cylinder and/or a motor. For example, the driving member 191 may be a shaft driver providing a power/mechanism to move the movement shaft 193, thereby moving the fixing plate 13 and the pins 12. The movement shaft 193 may be moved in the first direction D1 by power transmitted by the driving member 191. Thus, the fixing plate 13 and the pin 12 may also move in the first direction D1. For example, the movement shaft 193 may be a shaft performing an up-and-down linear motion, e.g., a reciprocating motion, thereby moving the pins 12 and the fixing plate 13 up-and-down in the first direction.

The vacuum pump V may be connected to the vacuum pressure-providing pipe 16. The vacuum pump V may provide the vacuum pressure to the flow path 16$h$ of the vacuum pressure-providing pipe 16. The vacuum pump V may provide the vacuum pressure into the inner space 11$h$ of the body 11 and/or the adsorption hole 17$h$ through the flow path 16$h$.

The driving unit A may be connected to the ball adsorption device 1. For example, the driving unit A may be coupled to the body 11. The driving unit A may move the ball adsorption device 1. For example, the driving unit A may horizontally move or rotate the ball adsorption device 1. The driving unit A may include at least one of various components capable of moving the ball adsorption device 1. In some embodiments, the driving unit A may include a motor and/or a hydraulic machine.

The guide unit 3 (see FIG. 5) may be disposed under the ball adsorption device 1. The guide unit 3 may include a guide member 31 (see FIG. 5) and a support member 33 (see FIG. 5). The guide member 31 may be located to be spaced apart in the first direction D1 from the adsorption plate 17. For example, the guide member 31 may be placed beyond the adsorption plate 17. For example, the guide member 31 may be disposed under the adsorption plate 17, e.g., when the adsorption hole 17$h$ faces downwards. The guide member 31 may be disposed under the adsorption plate 17 in various forms. These will be described later in more detail.

The stage 5 (see FIG. 7), the observation unit 7 (see FIG. 8) and the ball supplier 9 (see FIG. 3) will be described later in detail with reference to FIGS. 3 to 12.

Figure 4:
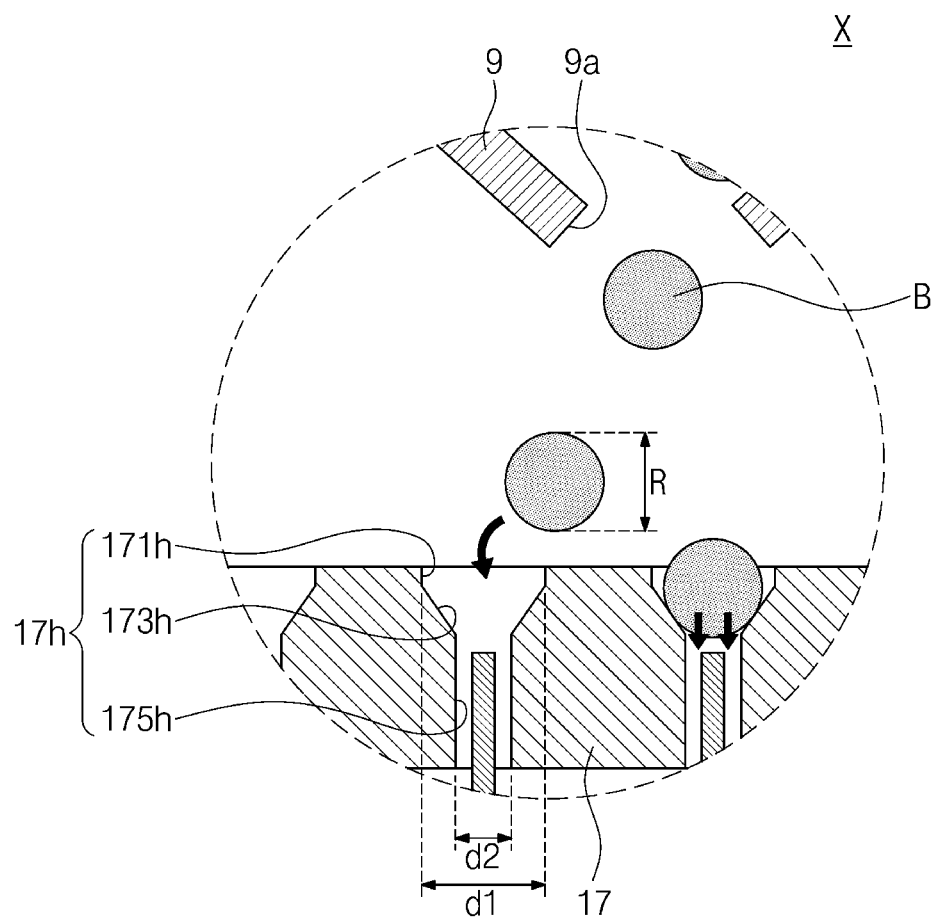
FIG. 4 is an enlarged cross-sectional view of a portion 'X' of FIG. 3.

FIG. 3 is a cross-sectional view illustrating a process in which a ball is adsorbed to a ball adsorption device according to some embodiments of the inventive concepts, and FIG. 4 is an enlarged cross-sectional view of a portion 'X' of FIG. 3.

Referring to FIG. 3, the ball supplier 9 and a ball supplier-driving unit M may further be provided. The ball supplier 9 may receive the ball B in its inside, e.g., in a ball holding area 9$h$. The ball B may include a conductive material. For example, the ball B may include a solder ball. The ball supplier-driving unit M may move the ball supplier 9.

The turning of the ball adsorption device over (S11, see FIG. 1) may include rotating the ball adsorption device about an axis parallel to the second direction D2. The adsorption hole 17$h$ may face upward. The ball supplier 9 and the ball supplier-driving unit M may be disposed over the ball adsorption device.

The providing of the vacuum pressure (S12, see FIG. 1) may include providing the vacuum pressure to the adsorption hole 17$h$ by the vacuum pump V. The vacuum pressure applied from the vacuum pump V may be provided to the adsorption hole 17$h$ through the flow path 16$h$ and the inner space 11$h$. Thus, the adsorption hole 17$h$ exposed upward may suck air downward.

Referring to FIG. 4, the adsorption hole 17$h$ may include a connection adsorption hole 175$h$, an expanded adsorption hole 173$h$, and a parallel adsorption hole 171$h$. A diameter of the connection adsorption hole 175$h$ may be constant along the first direction D1. The diameter of the connection adsorption hole 175$h$ may be indicated by a reference designator d2. The connection adsorption hole 175$h$ may be connected to the inner space 11$h$ (see FIG. 3). The expanded adsorption hole 173$h$ may be located between the connection adsorption hole 175$h$ and the parallel adsorption hole 171$h$. A diameter of the expanded adsorption hole 173$h$ may increase as a distance in the first direction D1 from a top end of the expanded adsorption hole 173$h$ increases. For example, the diameter of the expanded adsorption hole 173$h$ may continuously increase from the top to the bottom of the expanded adsorption hole 173$h$. For example, the expanded adsorption hole 173$h$ may have a truncated cone shape. The maximum diameter of the expanded adsorption hole 173$h$ may be indicated by a reference designator d1. The minimum diameter of the expanded adsorption hole 173$h$ may be indicated by the reference designator d2. The parallel adsorption hole 171$h$ may be located in the first direction D1 from the expanded adsorption hole 173$h$. The parallel adsorption hole 171$h$ may be connected to the expanded adsorption hole 173$h$. A diameter of the parallel adsorption hole 171$h$ may be constant along the first direction D1. The diameter of the parallel adsorption hole 171$h$ may be indicated by the reference designator d1. The diameter d1 of the parallel adsorption hole 171$h$ may be greater than the diameter d2 of the connection adsorption hole 175$h$.

The adsorbing of the ball (S13, see FIG. 1) may include dropping the ball B through an opening 9$a$ of the ball supplier 9 by the ball supplier 9. A diameter of the ball B may be indicated by a reference designator R. In some embodiments, the diameter of the ball B may range from 130 μm to 190 μm. However, embodiments of the inventive concepts are not limited thereto. In certain embodiments, a ball having a smaller diameter may be used and/or a ball having a greater diameter may be used. The diameter R of the ball B may be less than the diameter d1 and may be greater than the diameter d2. The dropped ball B may be adsorbed into the adsorption hole 17$h$ by negative pressure (i.e., the vacuum pressure) of the adsorption hole 17$h$. For example, at least a portion of the ball B may be located in the parallel adsorption hole 171$h$. The ball B may be in contact with an inner surface of the expanded adsorption hole 173$h$. Since the diameter R of the ball B is greater than the diameter d2 of the connection adsorption hole 175$h$, the ball B may not enter the connection adsorption hole 175$h$. The ball supplier 9 may sequentially drop the balls B while moving in the second direction D2 and/or the third direction D3. The balls B supplied by the ball supplier 9 may be adsorbed into all of the plurality of adsorption holes 17$h$.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The turning of the ball adsorption device over again (S14, see FIG. 1) may include turning the ball adsorption device over again by the driving unit A. For example, the ball adsorption device having the adsorption holes 17h into which the balls B are respectively adsorbed may be rotated about the axis parallel to the second direction D2.

According to the ball disposition system and the method for disposing the ball on the substrate in the embodiments of the inventive concepts, the ball may be adsorbed to the adsorption plate in the state in which the ball adsorption device is turned over. Thus, the various embodiments disclosed herein may omit a process of jumping a ball to adsorb the ball to a ball adsorption device as in the conventional art in which the ball adsorption device is not turned over. Accordingly, the various embodiments disclosed herein may prevent the ball from colliding with the ball adsorption device. As a result, an impact applied to the adsorption plate may be prevented and damage of the adsorption plate may be prevented. In addition, the various embodiments disclosed herein may prevent a ball disposition process from being performed in a state in which the ball is not adsorbed into the adsorption hole. Furthermore, the various embodiments disclosed herein may prevent a phenomenon in which balls are gathered around another ball previously adsorbed in the adsorption hole. For example, a single ball may be adsorbed in each of the adsorption holes.

Figure 5:
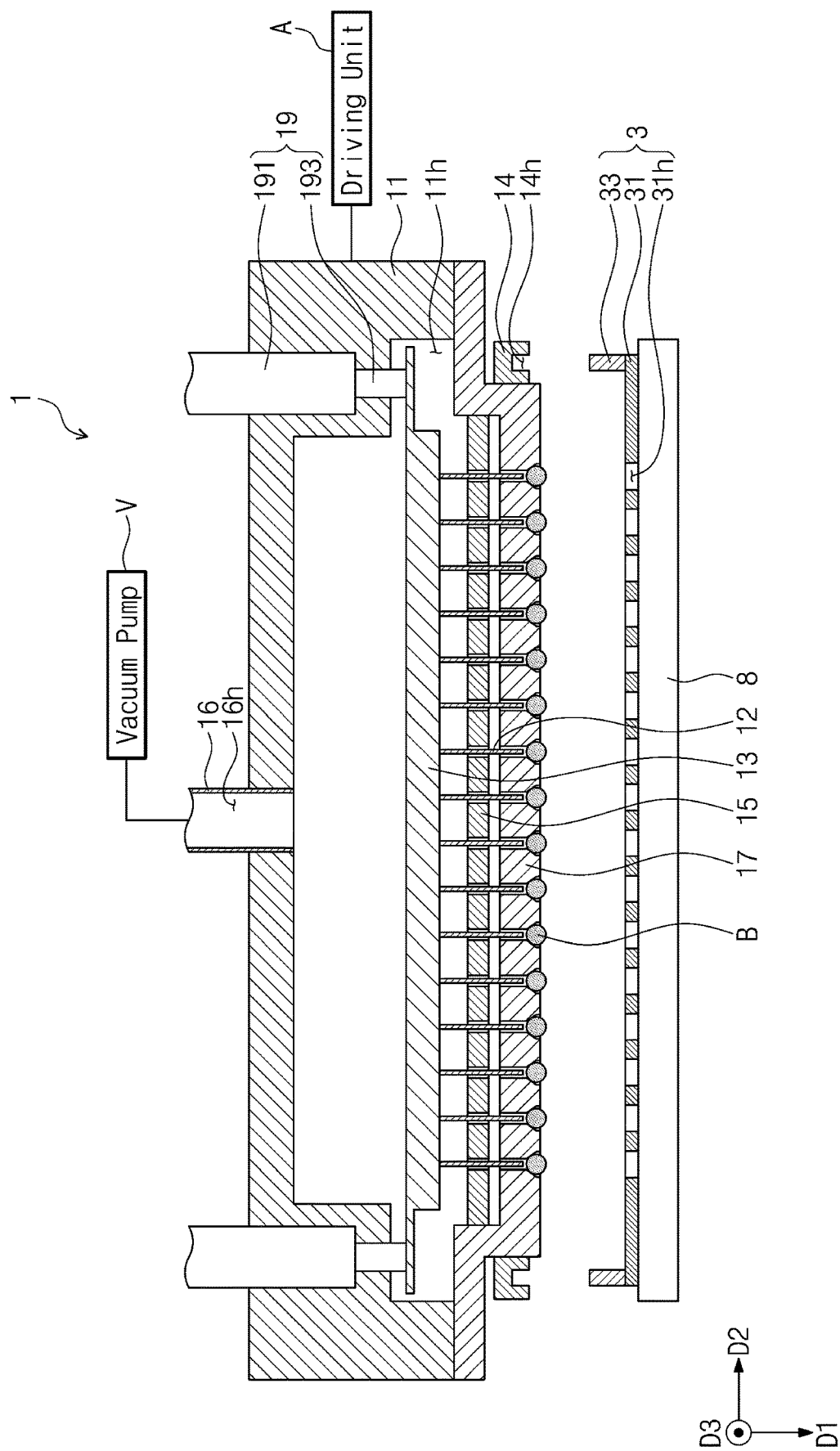
FIGS. 5 and 6 are cross-sectional views illustrating a process in which a guide member is coupled to a ball adsorption device according to some embodiments of the inventive concepts.
Figure 6:
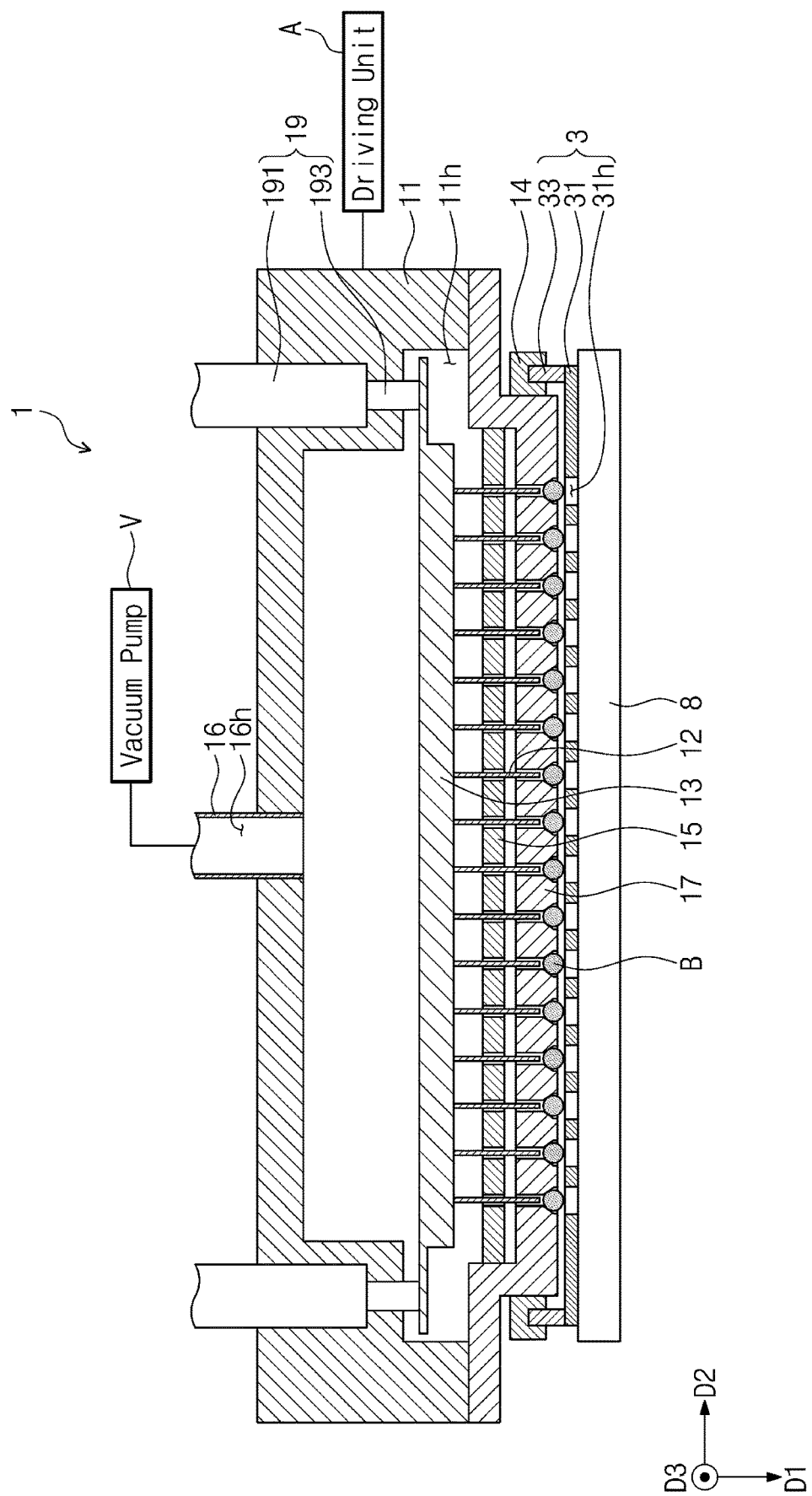

FIGS. 5 and 6 are cross-sectional views illustrating a process in which a guide member is coupled to a ball adsorption device according to some embodiments of the inventive concepts.

Referring to FIG. 5, the coupling of the ball adsorption device and the guide member to each other (S21, see FIG. 1) may include disposing the ball adsorption device above the guide unit 3. The guide unit 3 may be disposed on a guide unit-stage 8. For example, the guide unit stage 8 may be used to attach/detach the guide member to the ball adsorption device. The guide unit 3 may include the guide member 31 and the support member 33. The guide member 31 may have a plate shape extending in the second direction D2 and/or the third direction D3. For example, the guide member 31 may include a metallic material. The guide member 31 may provide a guide hole 31h. The guide hole 31h may extend in the first direction D1. The guide hole 31h may penetrate the guide member 31 e.g., in the first direction. The guide member 31 may include a plurality of guide holes 31h. The plurality of guide holes 31h may be spaced apart from each other in the second direction D2 and/or the third direction D3. The guide holes described herein may be ball guide holes through which balls are guided while the balls pass through the holes. The support member 33 may be coupled to the guide member 31. The support member 33 may extend in the first direction D1. The support member 33 may include a corresponding magnet corresponding to the coupling magnet. For example, the support member may be made of a magnetic material. The support member 33 and similar components described herein may be a support supporting and holding the guide member 31 or a similar one. For example, the support member 33 may support the guide member 31 to stay stable with respect to other components of the ball disposition system, e.g., by connecting the guide member to the adsorption plate 17 or another component. For example, the support member 33 may be a connector connecting the guide member 31 to another component of the ball adsorption device 1 or a component of the ball disposition system. For example, the support member 33 may be a rigid support, e.g. a rod or a bar, which may have a post shape or a shape that extends lengthwise in the third direction D3, such as a rail shape. In certain embodiments, the support member may be made of a metal. Though only cross-sectional view are shown in the figures, there may be multiple rows of balls are disposed on multiple rows of pads formed on the substrate in some embodiments.

Referring to FIG. 6, the ball adsorption device may move in the first direction D1. For example, the ball adsorption device may be lowered by the driving unit A. The support member 33 may be inserted into a coupling hole 14h of the coupling member 14. The coupling magnet of the coupling member 14 may be magnetically coupled to the corresponding magnet of the support member 33. For example, both of the coupling member 14 and the support member 33 may be made of magnetic material. Thus, the guide unit 3 may be coupled to the ball adsorption device. Accordingly, the guide member 31 may be disposed under the adsorption plate 17. For example, the guide member 31 may be spaced apart from a bottom surface of the adsorption plate 17 in the first direction D1. For example, the guide member 31 may be disposed under the adsorption plate 17 in the state of being spaced apart from the bottom surface of the adsorption plate 17 in the first direction D1 by the support member 33 coupled to the adsorption plate 17.

Figure 7:
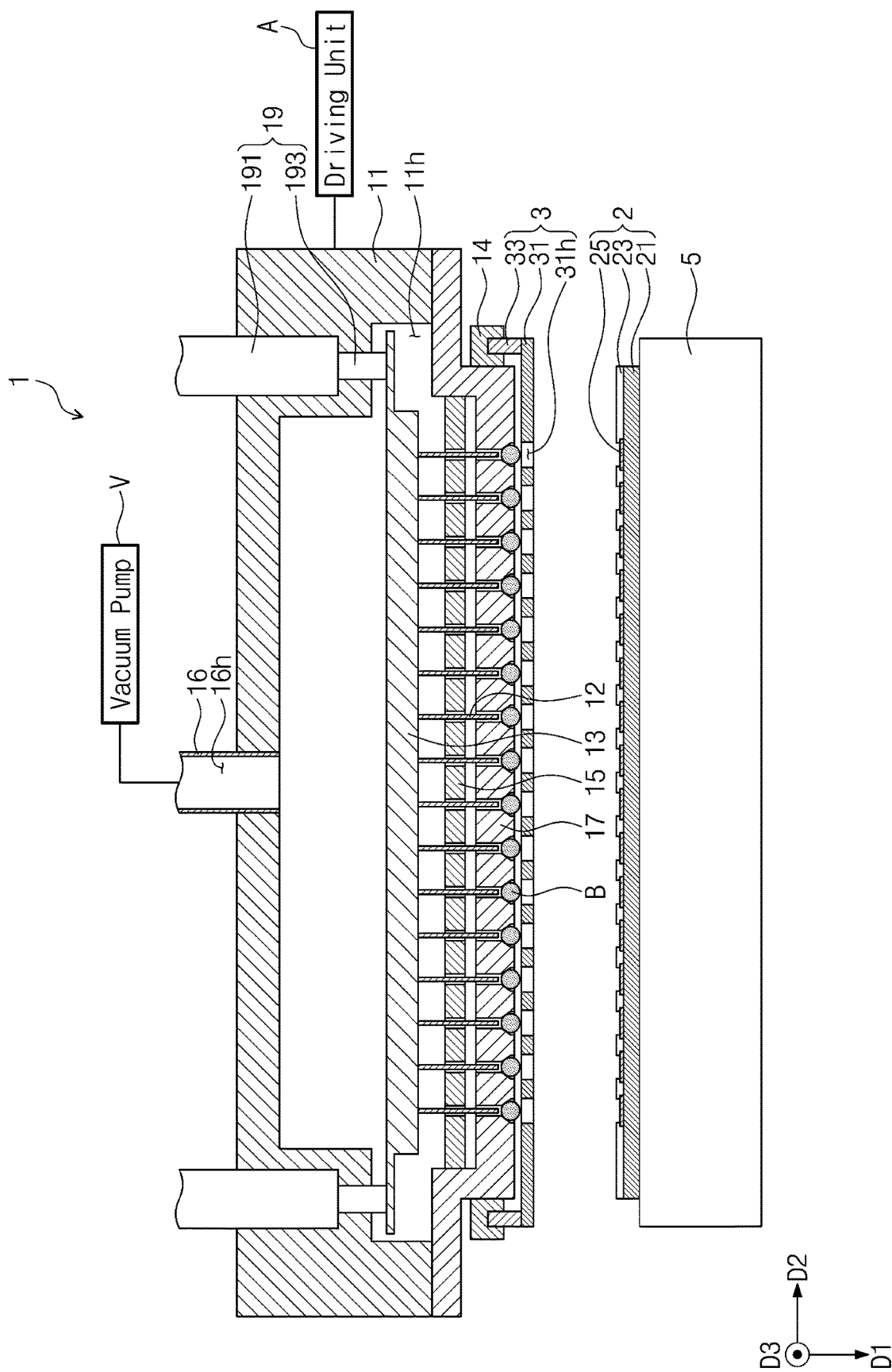
FIG. 7 is a cross-sectional view illustrating a ball disposition system according to some embodiments of the inventive concepts.

FIG. 7 is a cross-sectional view illustrating a ball disposition system according to some embodiments of the inventive concepts.

Referring to FIG. 7, the disposing of the ball adsorption device above the substrate (S22, see FIG. 1) may include disposing the ball adsorption device above the stage 5. A substrate 2 may be provided on the stage 5. The stage 5 may fix/hold the substrate 2 at a predetermined position by using vacuum pressure. To achieve this, a vacuum hole may be provided in the stage 5. The substrate 2 may be a component on which a ball is bonded. In some embodiments, the substrate 2 may include a printed circuit board (PCB). The substrate 2 may include a core 21, an upper insulating portion 23, and a pad 25. The core 21 may include a circuit interconnection line therein. The upper insulating portion 23 may be located on the core 21. The upper insulating portion 23 may include an insulating material. The pad 25 may be exposed from the upper insulating portion 23. The pad 25 may be located on the core 21. The pad 25 may include a conductive material. For example, the pad 25 may include a metal. The pad 25 may be electrically connected to the circuit interconnection line provided in the core 21. A flux F (see FIG. 10) may be applied on the pad 25. The flux F may include a strong-viscosity material. The substrate 2 may include a plurality of pads 25. The plurality of pads 25 may be spaced apart from each other in the second direction D2 and/or the third direction D3. The ball adsorption device may be disposed on the substrate 2. For example, the ball adsorption device may be moved by the driving unit A and thus may be located on the substrate 2.

Figure 8:
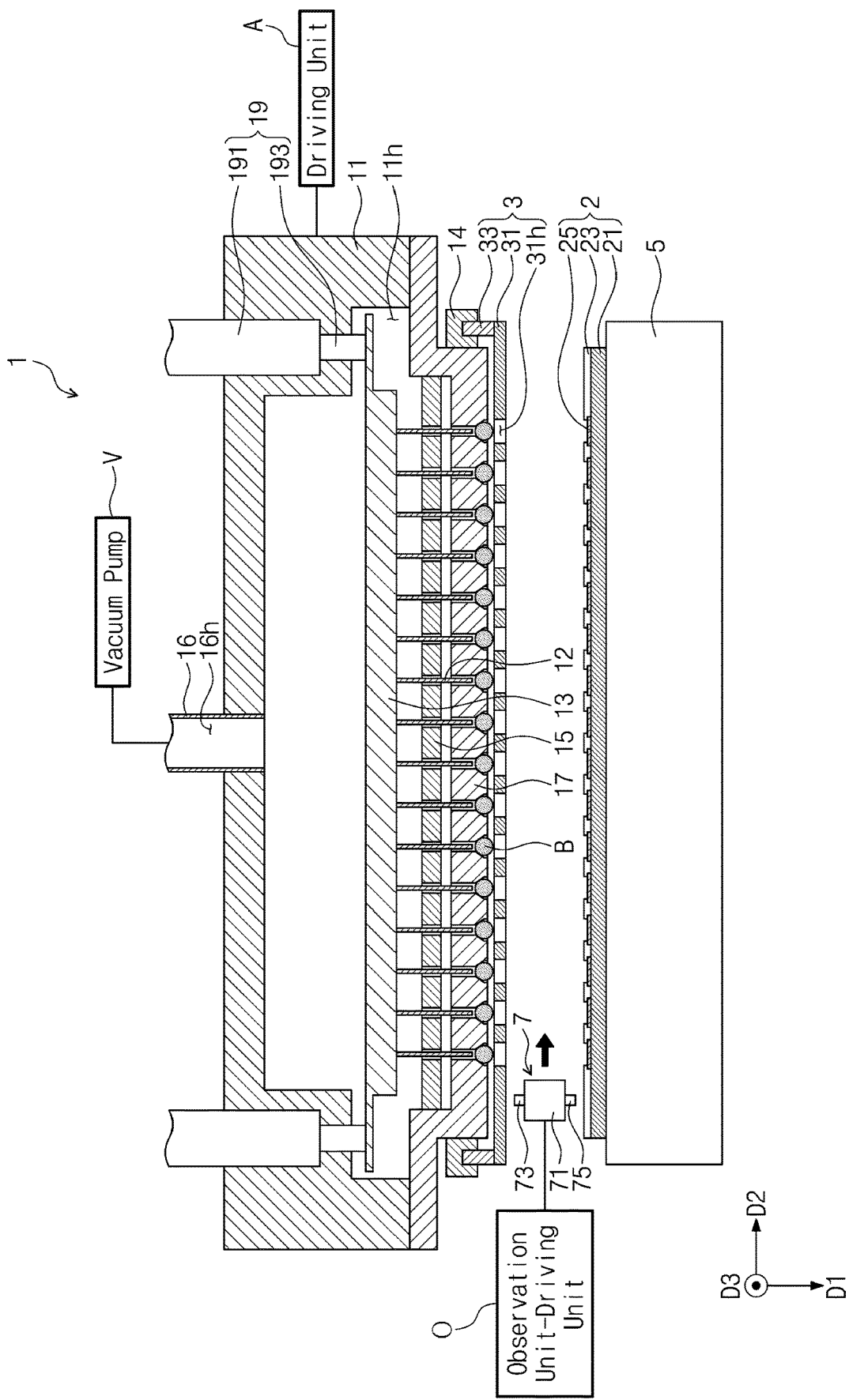
FIG. 8 is a cross-sectional view illustrating a process of measuring a flatness of a substrate and a ball adsorption device according to some embodiments of the inventive concepts.

FIG. 8 is a cross-sectional view illustrating a process of measuring a flatness of a substrate and a ball adsorption device according to some embodiments of the inventive concepts.

Referring to FIG. 8, the measuring of the flatness of the ball adsorption device and the substrate (S23, see FIG. 1) may include measuring the flatness of the ball adsorption device and/or the substrate 2 by the observation unit 7. The measuring the flatness as used herein may refer to measuring horizontality or level. For example, the observation unit 7 may measure horizontality/level of the ball adsorption device and/or the substrate 2. The observation unit 7 may include an observation body 71, an upper sensor 73, and a lower sensor 75. The observation body 71 may be connected to an observation unit-driving unit O. For example, the observation unit may be an inspection sensor block including the upper sensor 73, the lower sensor 75 and the body 71.

For example, the inspection sensor block may inspect horizontality of the ball adsorption device and/or the substrate 2. The upper sensor 73 may be coupled to (e.g., disposed on) a top of the observation body 71. The upper sensor 73 may measure a distance between the upper sensor 73 and the adsorption plate 17, a distance between the upper sensor 73 and the ball B, and/or a distance between the upper sensor 73 and the guide member 31. The measurement of the distance may be performed by at least one of various methods. For example, the upper sensor 73 may measure the distance by an infrared sensor. The lower sensor 75 may be coupled to a bottom of the observation body 71. For example, the lower sensor 75 may be disposed on the bottom of the observation body 71. The lower sensor 75 may measure a distance between the lower sensor 75 and the substrate 2. The measurement of the distance may be performed by at least one of various methods. For example, the lower sensor 75 may measure the distance by an infrared sensor.

The distance measurement process may be performed while moving the observation body 71. The observation body 71 may be moved by the observation unit-driving unit O. For example, the observation body 71 may be moved in the second direction D2 and/or the third direction D3 by power provided from the observation unit-driving unit O. The observation unit-driving unit O may include at least one of various components for moving the observation body 71. For example, the observation unit-driving unit O may include a motor. For example, the observation unit-driving unit O may be an inspection block driver driving the observation unit. The observation unit 7 may perform the distance measurement process while moving the observation body 71. For example, the observation unit 7 may perform the distance measurement process at two points spaced apart from each other in the second direction D2. The observation unit 7 may also perform the distance measurement process at two other points spaced apart from the measured two points in the third direction D3. For example, the observation unit 7 may perform the distance measurement process at four points. When the distances from the upper sensor 73 to the adsorption plate 17, the ball B and/or the guide member 31 are measured at the four points, it may be checked whether the adsorption plate 17 and/or the guide member 31 are disposed flat/horizontally. When the distances between the lower sensor 75 and the substrate 2 are measured at the four points, it may be checked whether the substrate 2 is disposed flat/horizontally. The observation unit 7 may transmit data on the measured distances to a controller. The controller may calculate the flatness/horizontality of the ball adsorption device and/or the substrate by using the data on the distances, received from the observation unit 7. The controller may determine whether the ball adsorption device and/or the substrate are properly disposed or not. When the flatness/horizontality is not in a certain numerical/predetermined range, the controller may determine that the ball adsorption device and/or the substrate are not properly disposed. In this case, the disposing of the ball adsorption device above the substrate (S22, see FIG. 1) may be performed again.

According to the ball disposition system and the method for disposing the ball on the substrate in the embodiments of the inventive concepts, the flatness of the substrate and/or the ball adsorption device may be measured by the observation unit. Thus, it may prevent the process of disposing the ball from being performed in a state in which the substrate and the ball adsorption device are not properly disposed. As a result, the accuracy of the process of disposing the ball may be improved.

Figure 9:
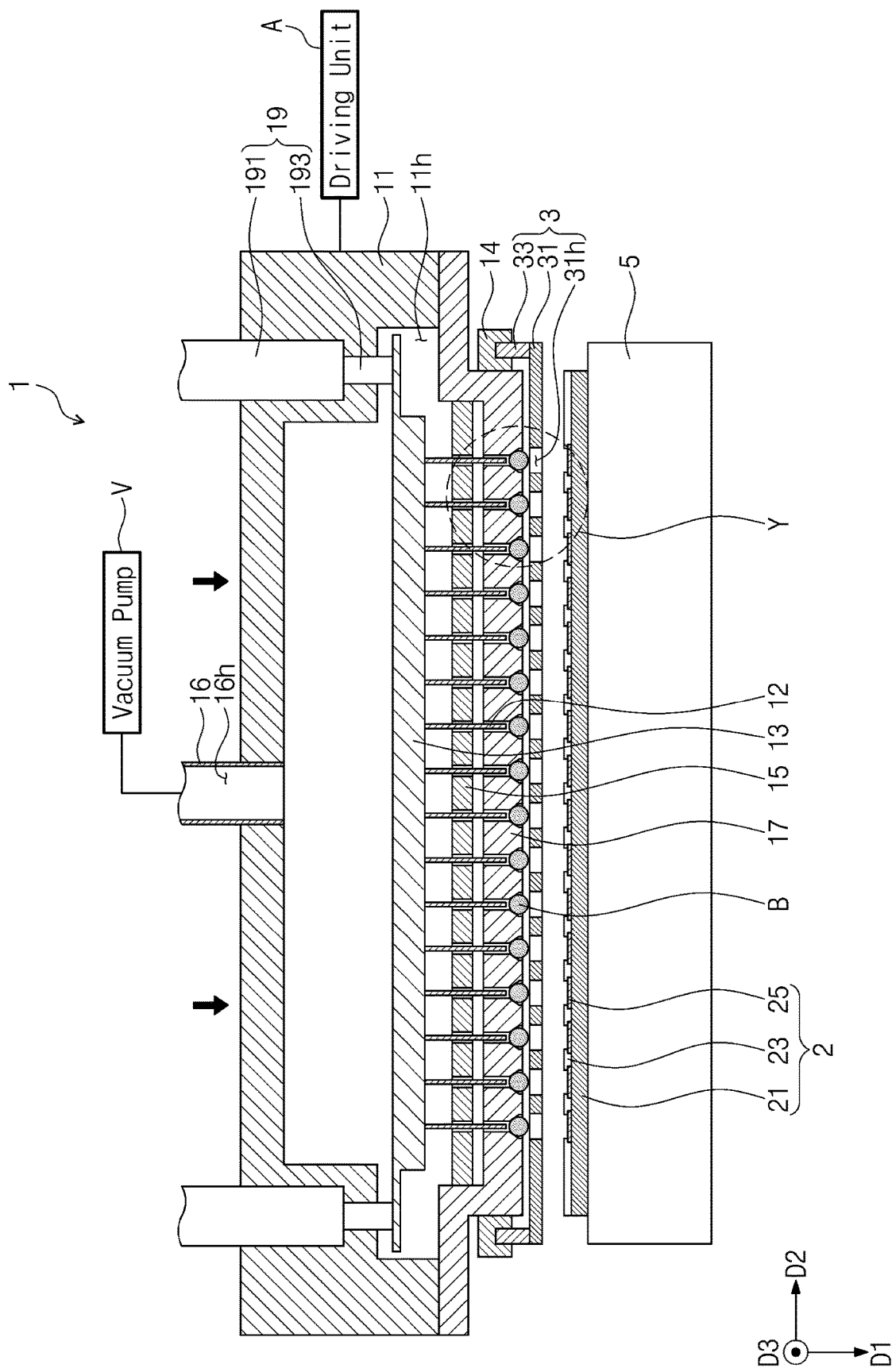
FIG. 9 is a cross-sectional view illustrating a state in which a ball adsorption device is disposed on a substrate according to some embodiments of the inventive concepts.
Figure 10:
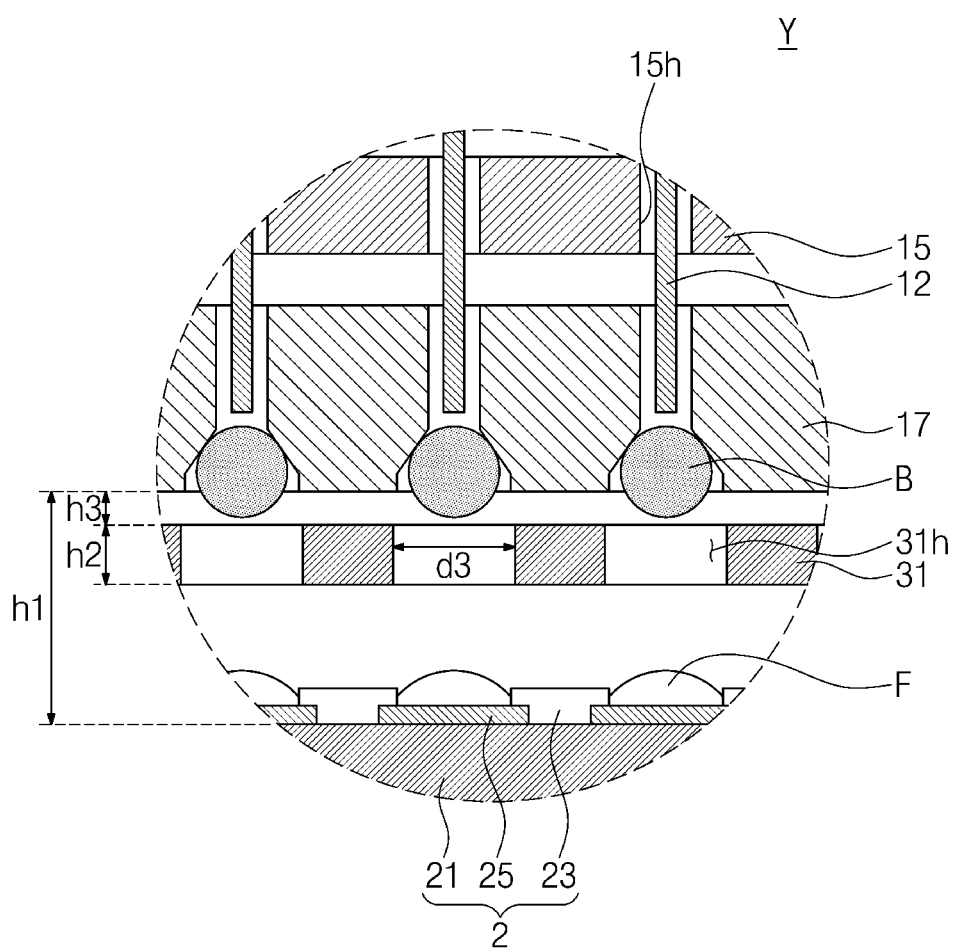
FIG. 10 is an enlarged cross-sectional view of a portion 'Y' of FIG. 9.

FIG. 9 is a cross-sectional view illustrating a state in which a ball adsorption device is disposed on a substrate according to some embodiments of the inventive concepts, and FIG. 10 is an enlarged cross-sectional view of a portion 'Y' of FIG. 9.

Referring to FIG. 9, the ball adsorption device may be moved downward. For example, the ball adsorption device may be moved in the first direction D1 by power provided from the driving unit A.

Referring to FIG. 10, the guide member 31 may be disposed adjacent to the substrate 2. A height of the guide member 31 may be indicated by a reference designator h2. A distance between the substrate 2 and the adsorption plate 17 may be indicated by a reference designator h1. A distance between the adsorption plate 17 and the guide member 31 may be indicated by a reference designator h3. The distance h1 between the substrate 2 and the adsorption plate 17 may be relatively great. Thus, if the guide member 31 does not exist, the ball B may not be accurately placed on the pad 25 and may deviate laterally when the ball B drops.

In some embodiments, a diameter d3 of the guide hole 31h may be greater than the diameter d1 (see FIG. 4) of the parallel adsorption hole 171h. In this case, the guide hole 31h may guide a path of the ball B dropping from the parallel adsorption hole 171h even though the dropping ball B slightly deviates bilaterally. In certain embodiments, the diameter d3 of the guide hole 31h may be equal to the diameter d1 of the parallel adsorption hole 171h.

Figure 11:
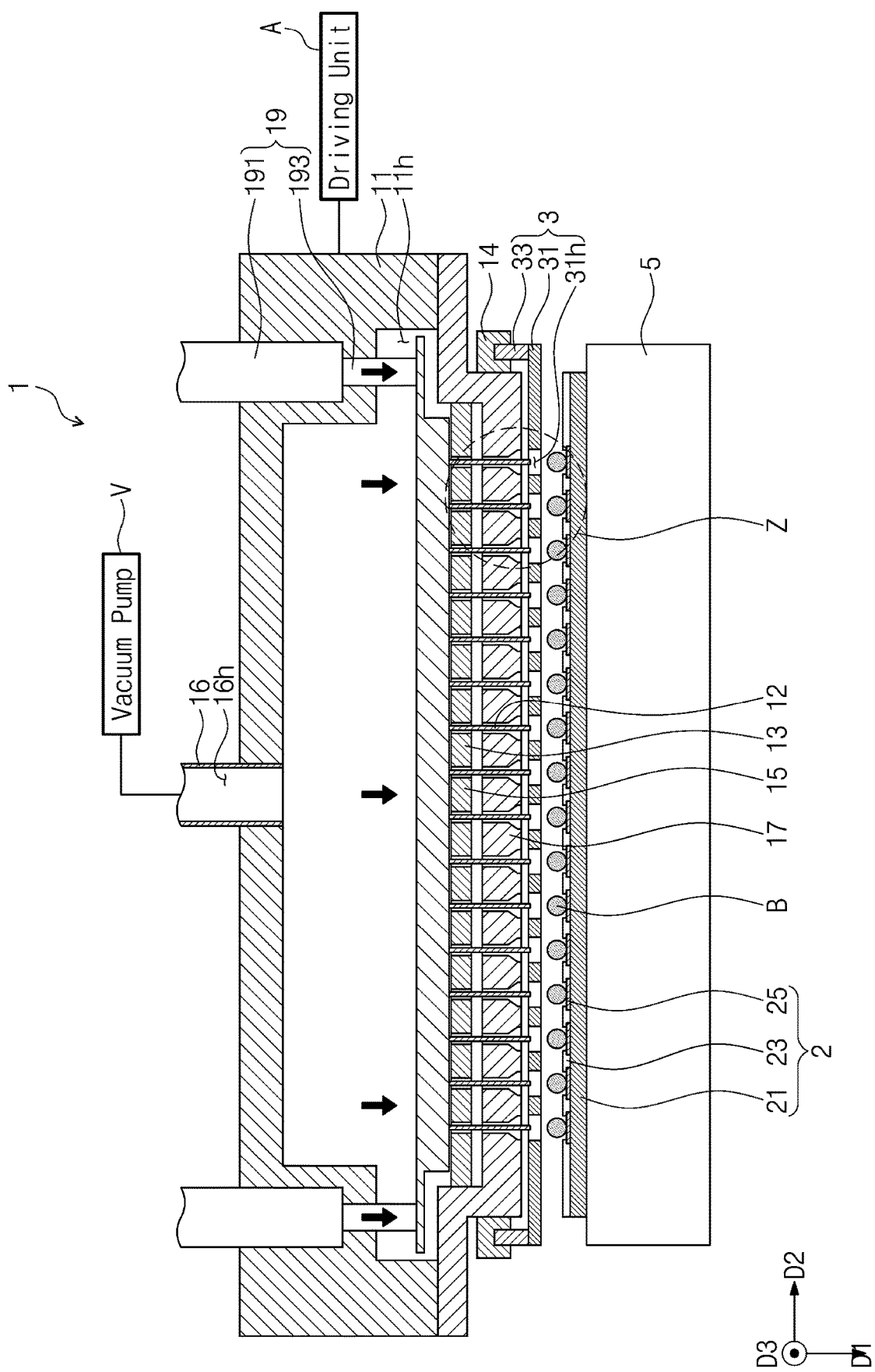
FIG. 11 is a cross-sectional view illustrating a state in which a ball is dropped from a ball adsorption device according to some embodiments of the inventive concepts.
Figure 12:
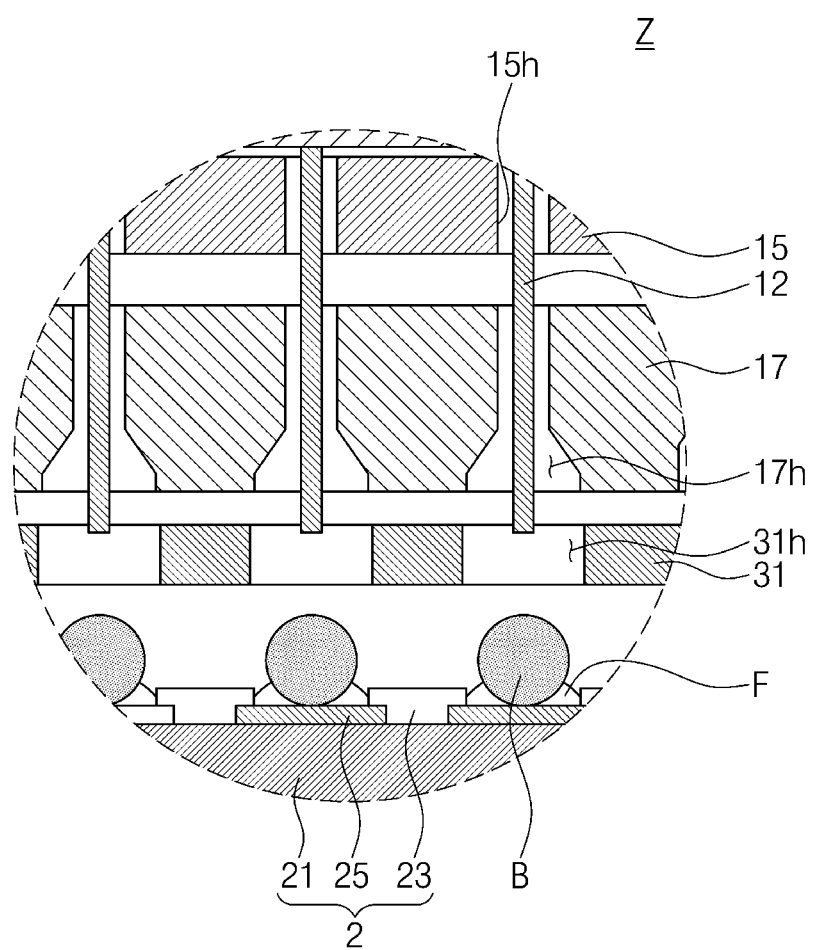
FIG. 12 is an enlarged cross-sectional view of a portion 'Z' of FIG. 11.

FIG. 11 is a cross-sectional view illustrating a state in which a ball is dropped from a ball adsorption device according to some embodiments of the inventive concepts, and FIG. 12 is an enlarged cross-sectional view of a portion 'Z' of FIG. 11.

Referring to FIGS. 11 and 12, the removing of the vacuum pressure (S311, see FIG. 1) may include removing the vacuum pressure applied to the adsorption hole 17h by the vacuum pump V. When the vacuum pressure applied to the adsorption hole 17h is removed, force adsorbing the ball B may be removed.

The pushing of the ball by the pin (S313, see FIG. 1) may include moving the pin 12 in the first direction D1 to push the ball B. For example, the driving member 191 may move the movement shaft 193, and thus the movement shaft 193 may move the fixing plate 13 in the first direction D1. When the fixing plate 13 descends, the pin 12 may be moved in the first direction D1. When the pin 12 is moved in the first direction D1, the ball B may be pushed downward.

In some embodiments, the removing of the vacuum pressure (S311) and the pushing of the ball by the pin (S313) may be performed substantially at the same time. However, embodiments of the inventive concepts are not limited thereto. In certain embodiments, the step S311 and the step S313 may be sequentially performed.

The passing of the ball through the guide member (S32, see FIG. 1) may include passing the ball B through the guide hole 31h of the guide member 31. In the specification, the term 'passing through' may include that the ball B enters the guide hole 31h and that the ball B exits from the guide hole 31h completely.

The placing of the ball on the pad (S33, see FIG. 1) may include disposing the ball B on the pad 25. The ball B may completely pass through the guide hole 31h and then may be disposed on the pad 25 in a state of being spaced apart from the guide member 31 in the first direction D1. However, embodiments of the inventive concepts are not limited thereto. In certain embodiments, the ball B may be disposed on the pad 25 in a state of being located in the guide hole 31h of the guide member 31. The ball B may be in contact with the flux F disposed on the pad 25. A lower portion of the ball B may be disposed in the flux F.

When the disposing of the ball on the substrate is completed, heating the substrate having the ball may be performed. For example, heat may be applied to the ball, flux F and the substrate. The heating of the substrate may include a reflow process. For example, heat may be applied in the state in which the ball is disposed on the pad, and thus a portion of the ball may melt. The melted portion of the ball may be bonded to the pad.

When the heating of the substrate is completed, a cleaning process may be performed. A remaining flux may be removed by the cleaning process.

When the cleaning process is completed, the substrate may be unloaded. The unloading of the substrate may be performed by an unloader. The substrate may be unloaded from the stage and then may be moved to mount a semiconductor chip.

According to the ball disposition system and the method for disposing the ball on the substrate in the embodiments of the inventive concepts, the guide member may guide movement of the ball. For example, the guide hole may guide a dropping path of the ball. The guide hole may guide the dropping path after the ball is separated from the adsorption hole and before the ball is placed on the pad. Thus, the method may prevent the ball from deviating laterally during the dropping. In certain examples, even though the pin pushes the ball toward a side, the ball may not deviate laterally but may drop straight downward. Thus, the ball may be accurately placed on the pad. For example, the process of disposing the ball on the pad of the substrate may be accurately performed, and a yield of the process may be improved. The method according to above described embodiments may prevent misplacement of the ball due to eccentric collision with the pin. The process may be performed in a state in which the ball adsorption device is further spaced apart upward from the substrate comparing to conventional art.

In case the ball rotates during the dropping, the flux may be splashed upward because of the rotation of the ball when the ball comes in contact with the flux. According to the ball disposition system and the method for disposing the ball on the substrate in the embodiments of the inventive concepts, the system and/or the method may prevent the flux from splashing the adsorption plate and/or the pin when the ball is placed on the pad. For example, the flux splashed by the ball may be blocked by the guide member. Thus, the guide member may prevent the flux from being splashed on the adsorption plate and/or the pin. As a result, contamination of the adsorption plate and/or the pin may be prevented. Thanks to the guide member, life span of the ball adsorption device may be improved, and a replacement period and/or a cleaning period may be increased. By using the ball disposition system and/or methods according to the embodiments, the process of disposing the ball on the substrate may be successively performed. Thus, a process speed may be improved.

According to the ball disposition system and the method for disposing the ball on the substrate in the embodiments of the inventive concepts, the guide member may be easily detached/attached from/to the ball adsorption device. When the coupling magnet and the corresponding magnet are used, the detachment/attachment of the guide member and the ball adsorption device may be quickly performed. Thus, when the guide member is contaminated by the flux, the contaminated guide member may be quickly replaced and/or cleaned.

According to the ball disposition system and the method for disposing the ball on the substrate in the embodiments of the inventive concepts, the process may be performed in the state in which the guide member is spaced apart upward from the substrate. For example, the process may be performed in a state in which the guide member is not in contact with the substrate. Thus, the space secured between the guide member and the substrate may prevent the substrate from being bent or contaminated by the guide member. The secured space may also prevent the substrate from being damaged by pressurization/force exerted from the guide member.

Figure 13:
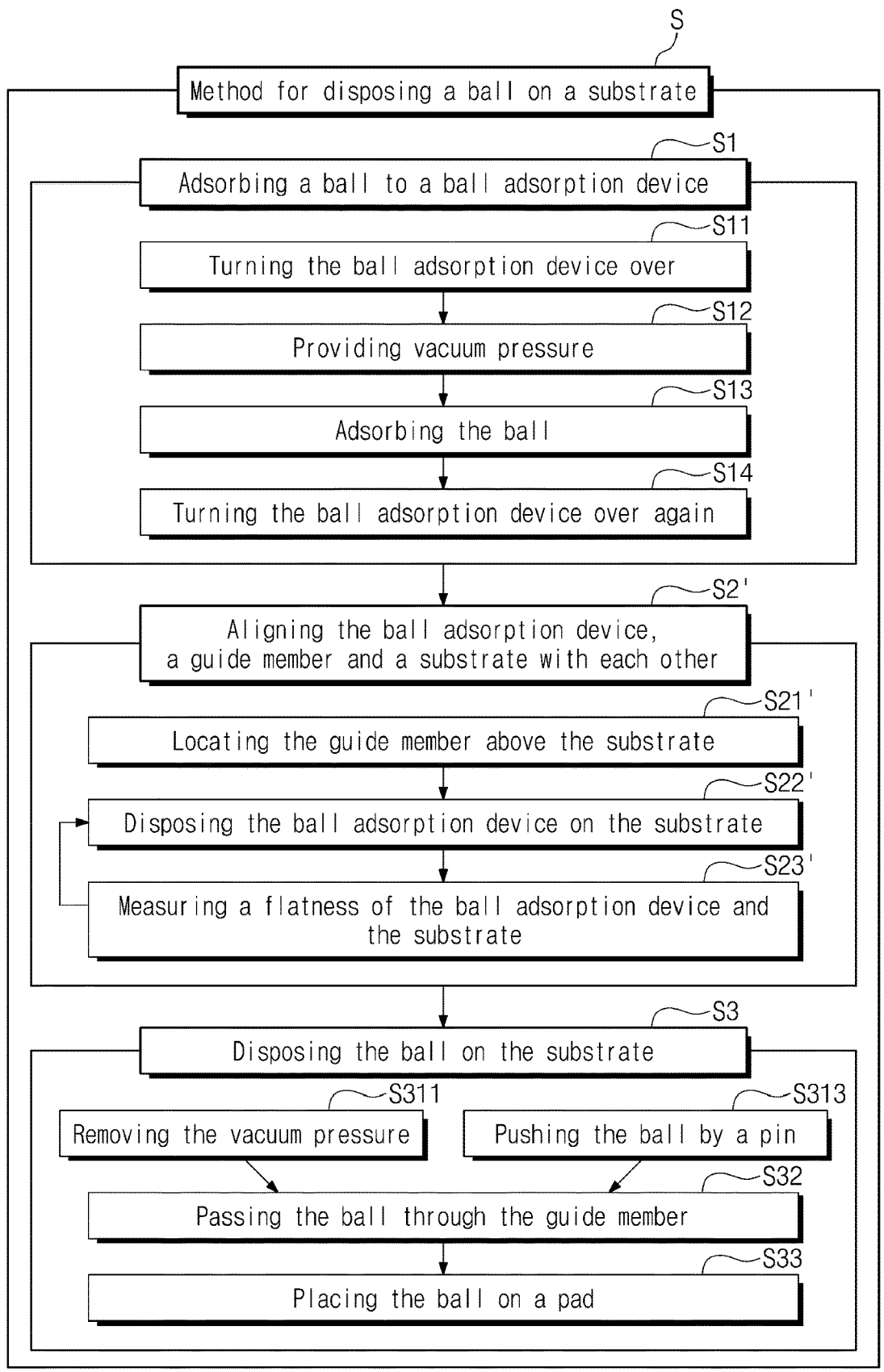
FIG. 13 is a flowchart illustrating a method for disposing a ball on a substrate, according to some embodiments of the inventive concepts.
Figure 14:
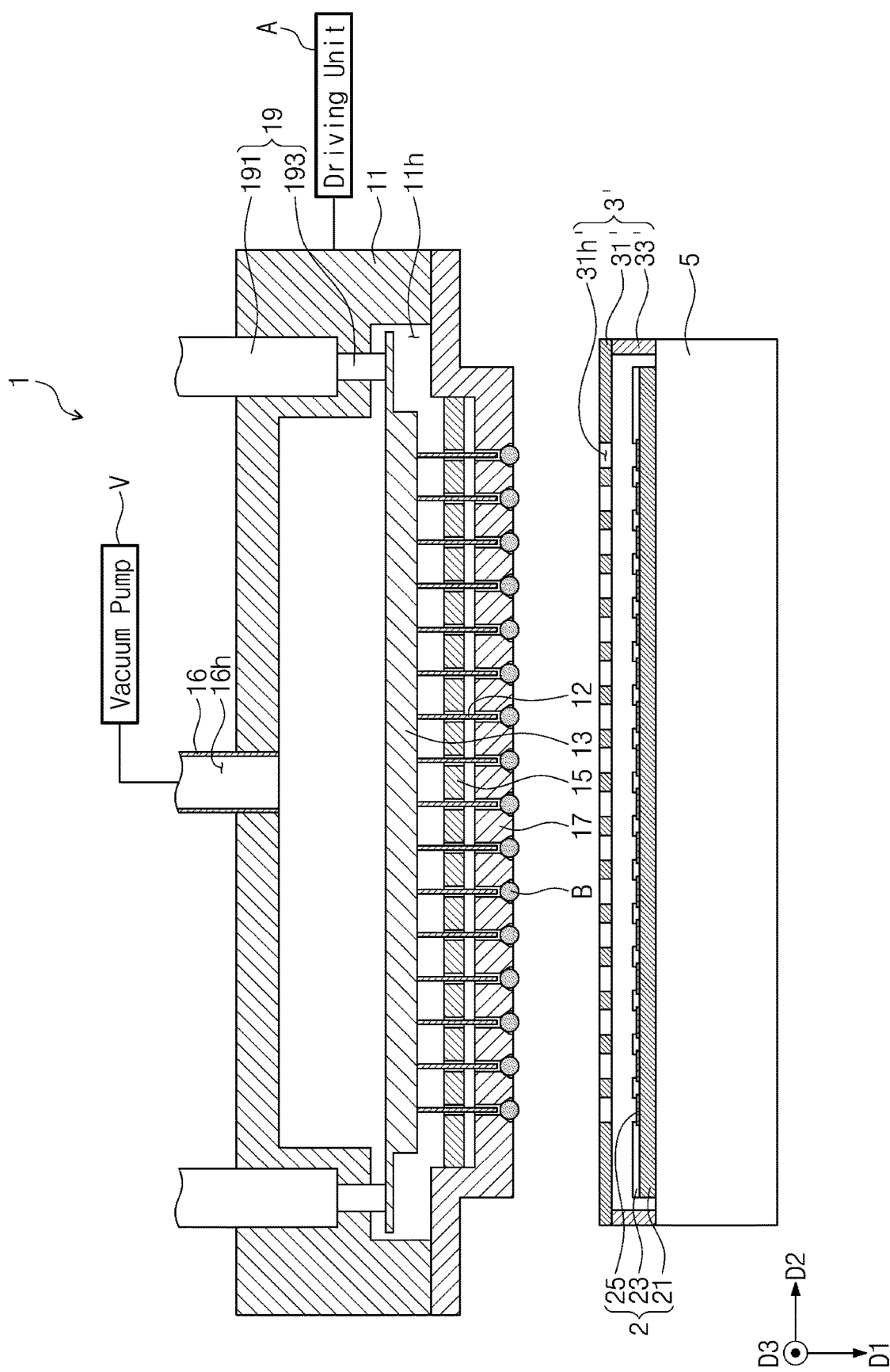
FIG. 14 is a cross-sectional view illustrating a ball disposition system according to some embodiments of the inventive concepts.
Figure 15:
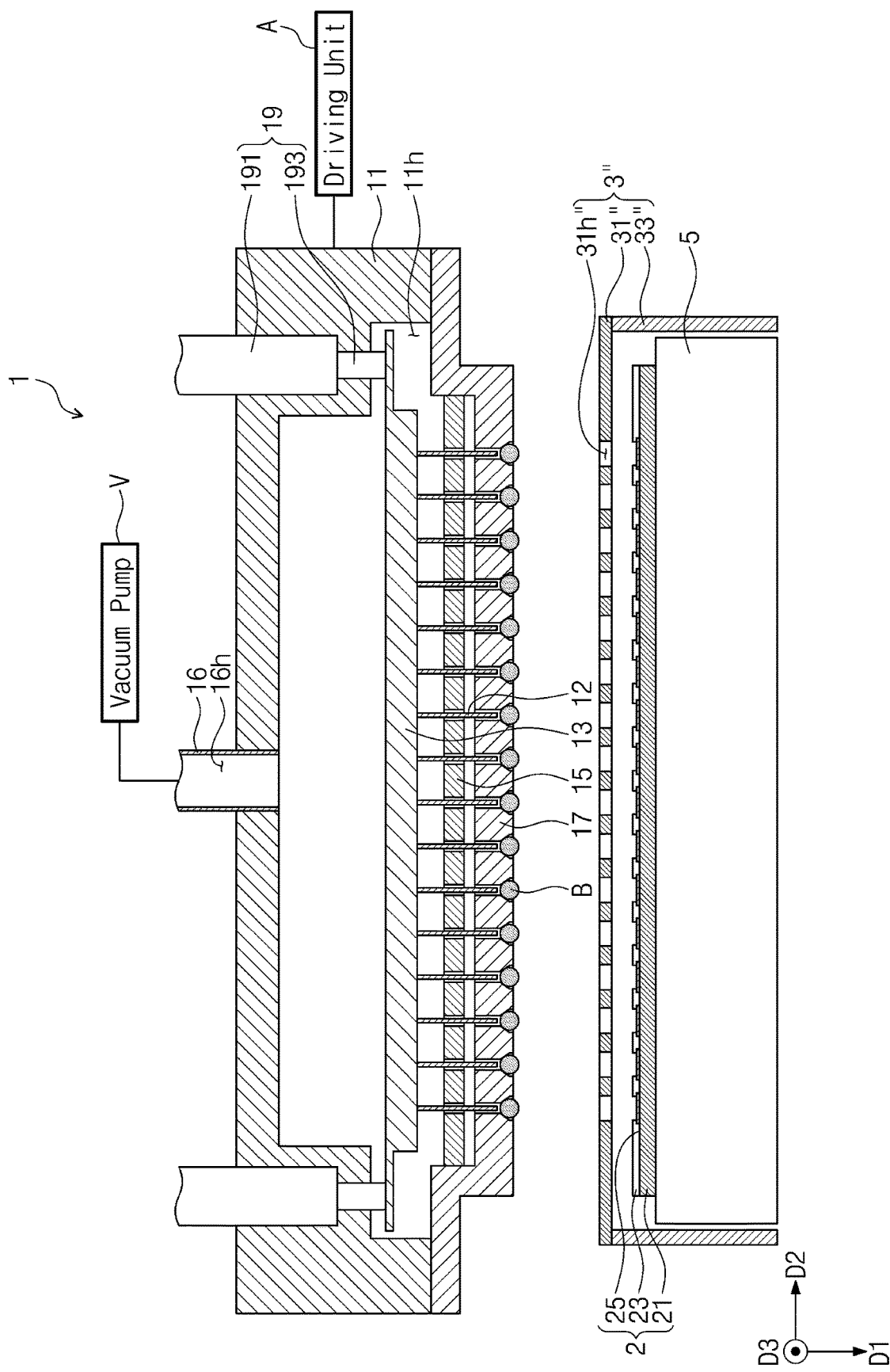
FIG. 15 is a cross-sectional view illustrating a ball disposition system according to some embodiments of the inventive concepts.

FIG. 13 is a flowchart illustrating a method for disposing a ball on a substrate, according to some embodiments of the inventive concepts, FIG. 14 is a cross-sectional view illustrating a ball disposition system according to some embodiments of the inventive concepts, and FIG. 15 is a cross-sectional view illustrating a ball disposition system according to some embodiments of the inventive concepts.

Hereinafter, the descriptions to the same as or similar to components and/or steps described above in relation to the embodiments illustrated in FIGS. 1 to 12 may be omitted for the purpose of ease and convenience in explanation.

Referring to FIG. 13, aligning a ball adsorption device, a guide member and a substrate with each other (S2') in a method S for disposing a ball on a substrate may be different from the step S2 of FIG. 1. Other steps of the method S for disposing the ball on the substrate may be substantially the same as or similar to the steps described with reference to FIG. 1.

The aligning of the ball adsorption device, the guide member and the substrate with each other (S2') may include locating the guide member above the substrate (S21'), disposing the ball adsorption device above the substrate (S22'), and measuring a flatness/horizontality of the ball adsorption device and the substrate (S23').

Referring to FIG. 14, the locating of the guide member above the substrate (S21') may include locating a guide member 31' at a certain position over the substrate 2. The guide member 31' may be fixed in a state of being spaced apart upward from the substrate 2 by a certain distance. A support member 33' may support the guide member 31'. The support member 33' may be connected to the stage 5. The support member 33' may be coupled to the stage 5. The guide member 31' may be fixed/held at a certain distance from the substrate 2 by the support member 33' extending from the stage 5 in a direction opposite to the first direction D1. Accordingly, the guide member 31' may be disposed under the adsorption plate 17. In addition, the guide member 31' may be disposed over the stage 5. For example, the guide member 31' may be spaced apart from a top surface of the stage 5 in the direction opposite to the first direction D1. For example, by the support member 33' coupled to the stage 5, the guide member 31' may be disposed over the stage 5 in the state of being spaced apart from the top surface of the stage 5 in the direction opposite to the first direction D1. Thus, the guide member 31' may be disposed between the adsorption plate 17 and the stage 5. For example, the guide member 31' may be disposed between the adsorption plate 17 and the stage 5 in certain steps of operation as the ball adsorption device 1 rotates in certain embodiments as shown in FIG. 3. For example, the guide member 31' may be configured to be disposed between the adsorption plate 17 and the stage 5.

Referring to FIG. 15, a support member 33" may extend in the first direction D1. The support member 33" may be supported by another component, not the stage 5. By the support member 33", a guide member 31" may be fixed/held in a state of being spaced apart upwardly from the substrate 2 by a certain distance. Accordingly, the guide member 31" may be disposed under the adsorption plate 17. In addition, the guide member 31" may be disposed over the stage 5. For example, the guide member 31" may be spaced apart from the top surface of the stage 5 in the direction opposite to the first direction D1. For example, the guide member 31" may be supported by the support member 33" and thus may be disposed over the stage 5 in the state of being spaced apart from the top surface of the stage 5 in the direction opposite to the first direction D1. Thus, the guide member 31" may be disposed between the adsorption plate 17 and the stage 5.

The disposing of the ball adsorption device above the substrate (S22') and the measuring of the flatness of the ball adsorption device and the substrate (S23') may be substantially the same as or similar to the steps S22 and S23 described with reference to FIG. 1.

Figure 16:
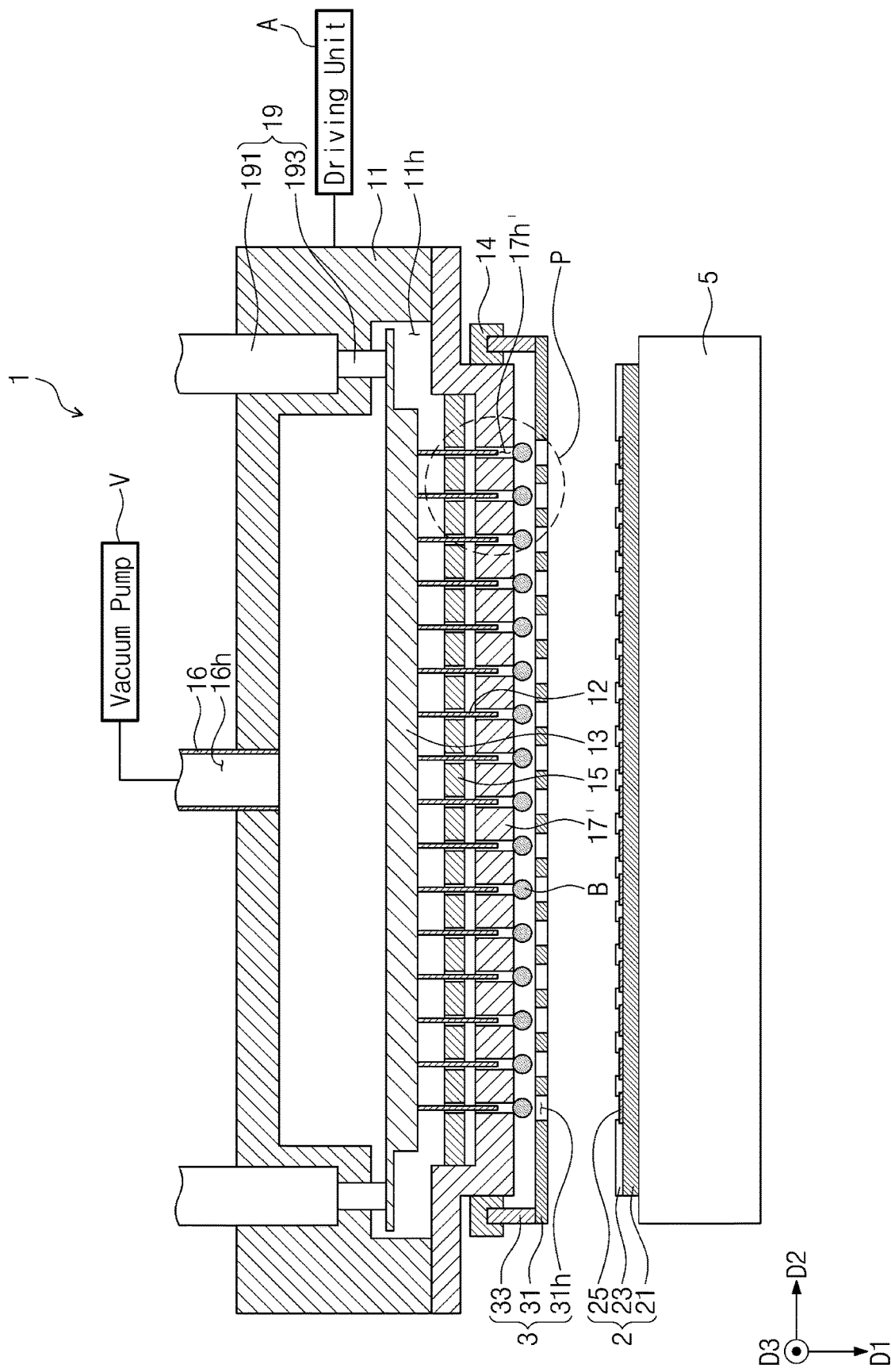
FIG. 16 is a cross-sectional view illustrating a ball disposition system according to some embodiments of the inventive concepts.
Figure 17:
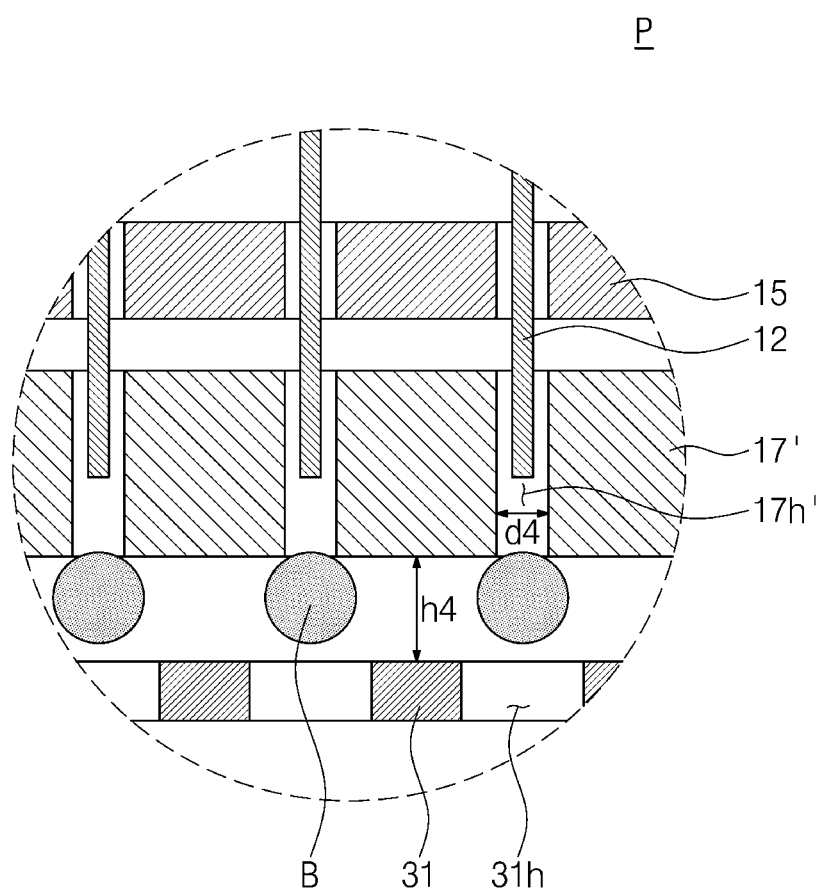
FIG. 17 is an enlarged cross-sectional view of a portion 'P' of FIG. 16.

FIG. 16 is a cross-sectional view illustrating a ball disposition system according to some embodiments of the inventive concepts, and FIG. 17 is an enlarged cross-sectional view of a portion 'P' of FIG. 16.

Hereinafter, the descriptions to the same or similar components and/or steps described with respect to the embodiments illustrated in FIGS. 1 to 15 may be omitted for the purpose of ease and convenience in explanation.

Referring to FIGS. 16 and 17, a diameter of an adsorption hole $17h'$ may be constant along the first direction D1. The diameter of the adsorption hole $17h'$ may be indicated by a reference designator d4. The diameter d4 of the adsorption hole $17h'$ may be less than the diameter R (see FIG. 4) of the ball B. Thus, only a portion of an upper portion of the ball B may enter the adsorption hole $17h'$. The ball B may be fixed/attached on the adsorption plate 17' and held at a position lower than the position described with reference to FIGS. 1 to 12. A distance h4 between an adsorption plate 17' and the guide member 31 may be greater than the distance h3 of FIG. 10.

Figure 18:
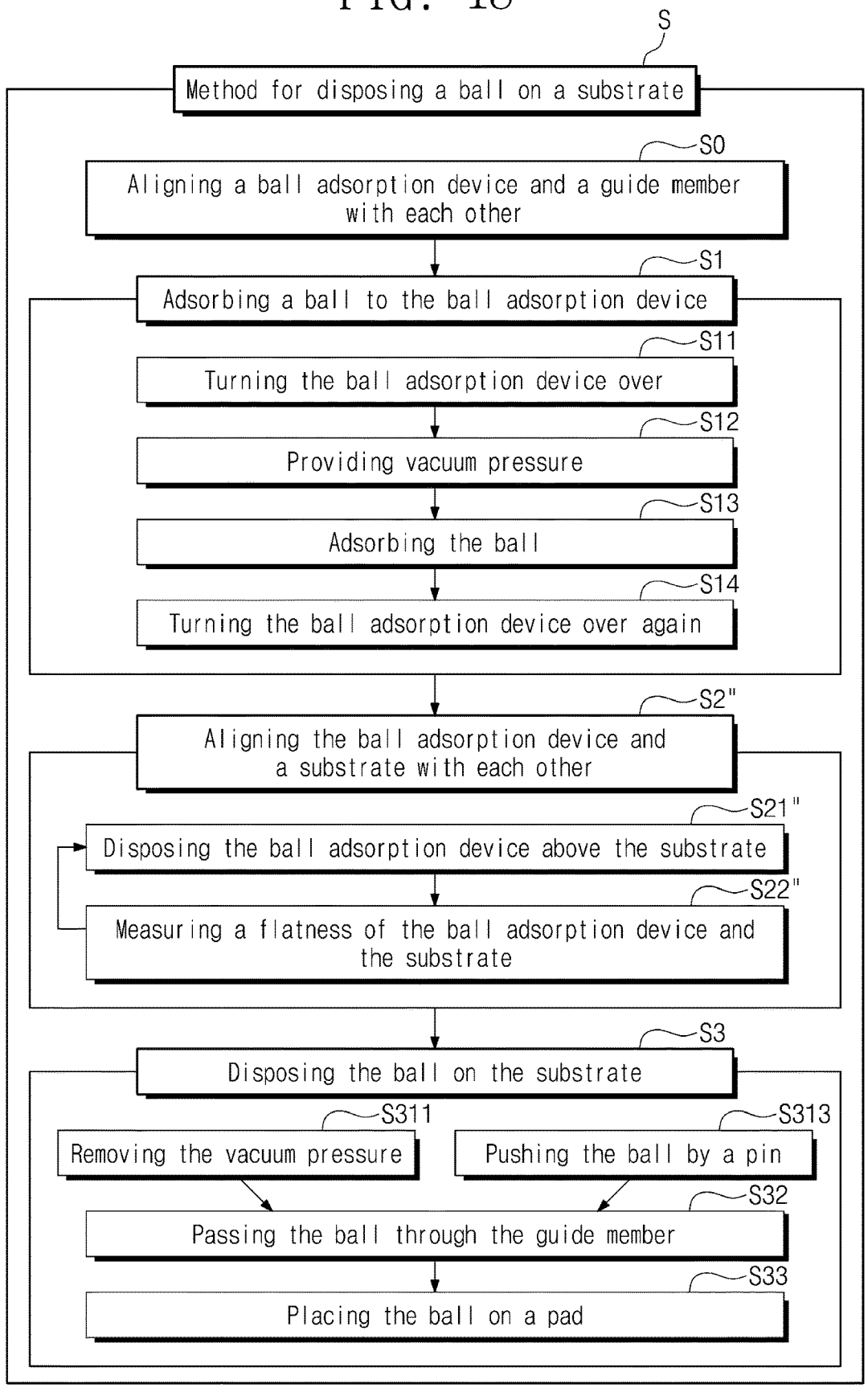
FIG. 18 is a flowchart illustrating a method for disposing a ball on a substrate, according to some embodiments of the inventive concepts.
Figure 19:
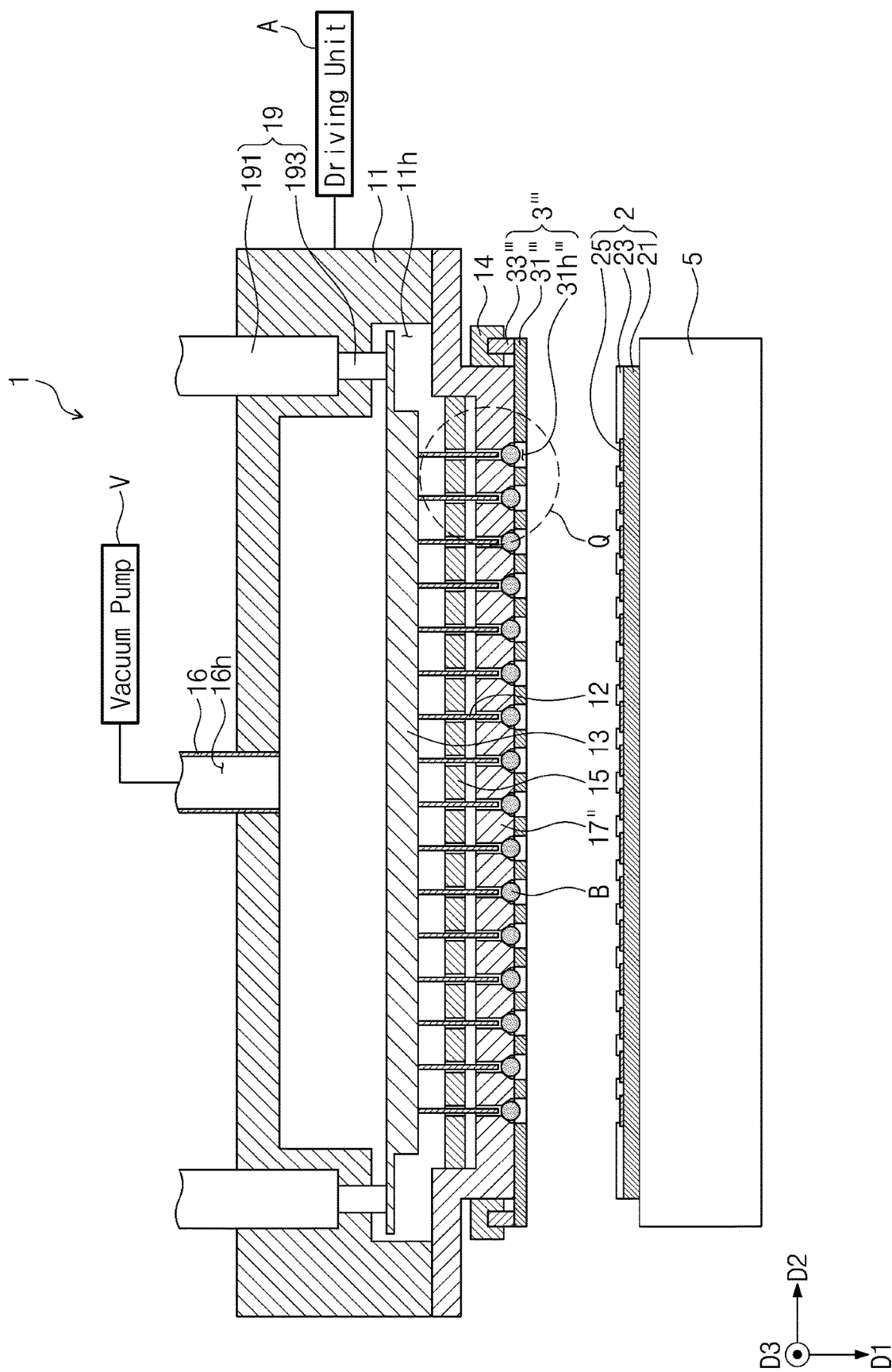
FIG. 19 is a cross-sectional view illustrating a ball disposition system according to some embodiments of the inventive concepts.

FIG. 18 is a flowchart illustrating a method for disposing a ball on a substrate, according to some embodiments of the inventive concepts. FIG. 19 is a cross-sectional view illustrating a ball disposition system according to some embodiments of the inventive concepts, and FIG. 20 is an enlarged cross-sectional view of a portion 'Q' of FIG. 19.

Hereinafter, the descriptions to the same or similar components and/or steps described in relation to the embodiments illustrated in FIGS. 1 to 17 may be omitted for the purpose of ease and convenience in explanation.

Referring to FIG. 18, a method S for disposing a ball on a substrate may include aligning a ball adsorption device and a guide member with each other (S0), adsorbing a ball to the ball adsorption device (S1), aligning the ball adsorption device and a substrate with each other (S2"), and disposing the ball on the substrate (S3). The adsorbing of the ball to the ball adsorption device (S1) and the disposing of the ball on the substrate (S3) may be substantially the same as or similar to the steps described with reference to FIG. 1.

Figure 20:
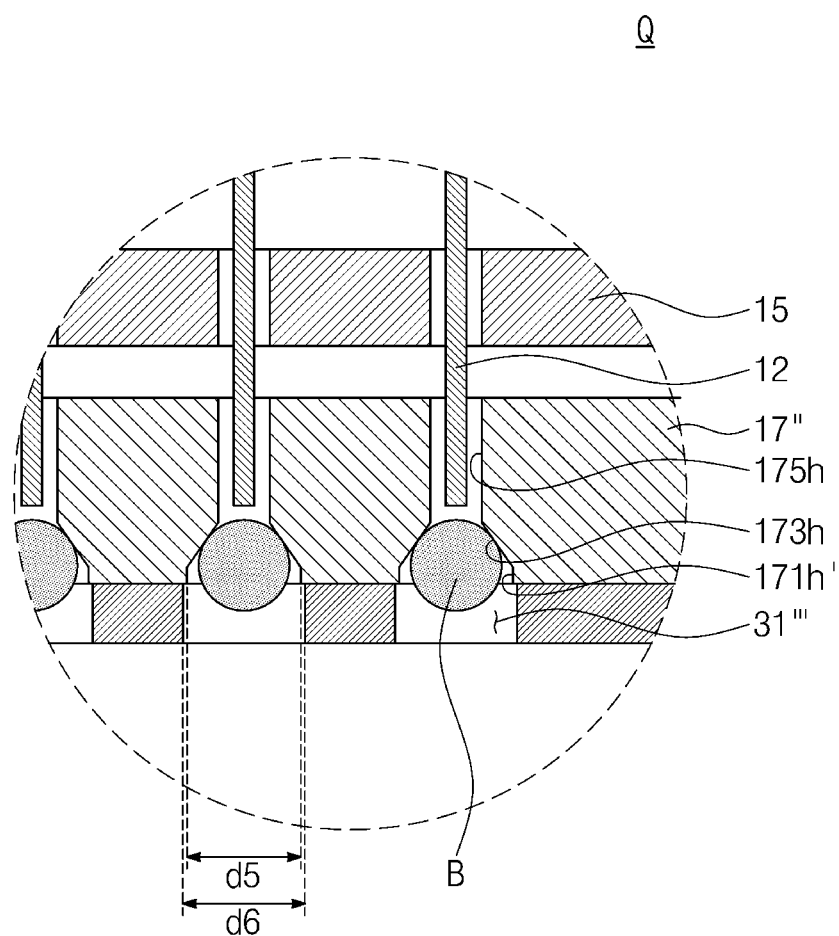
FIG. 20 is an enlarged cross-sectional view of a portion 'Q' of FIG. 19.

Referring to FIGS. 18, 19 and 20, the aligning of the ball adsorption device and the guide member with each other (S0) may include bringing a guide member 31''' into contact with an adsorption plate 17". For example, a top surface of the guide member 31''' may be in contact with a bottom surface of the adsorption plate 17". For example, an outer surface of the guide member 31''' may be in contact with an outer surface of the adsorption plate 17" that faces the outer surface of the adsorption plate 17". A parallel adsorption hole $171h'$ may be substantially connected to a guide hole $31h'''$. For example, the guide hole $31h'''$ may be located on an extension line of the adsorption hole and extends in the first direction. When the ball B is adsorbed to the adsorption plate 17", the ball B may not protrude downward from the guide member 31'''. A diameter d6 of the guide hole $31h'''$ may be greater than or substantially equal to a diameter d5 of the parallel adsorption hole $171h'$.

The guide member 31''' may be supported by a support member 33'''. The guide member 31''' may be in contact with the adsorption plate 17" in the state in which the guide member 31''' is supported by the support member 33'''. Accordingly, the guide member 31''' may be disposed under the adsorption plate 17". For example, the guide member 31''' may be connected to the bottom surface of the adsorption plate 17". For example, the guide member 31''' may be in contact with the bottom surface of the adsorption plate 17" by the support member 33''' coupled to the adsorption plate 17". Accordingly, the guide member 31''' may be disposed between the adsorption plate 17" and the stage 5.

Referring again to FIG. 18, the aligning of the ball adsorption device and the substrate with each other (S2") may include disposing the ball adsorption device above the substrate (S21") and measuring a flatness of the ball adsorption device and the substrate (S22"). The disposing of the ball adsorption device above the substrate (S21") and the measuring of the flatness of the ball adsorption device and the substrate (S22") may be substantially the same as or similar to the steps S22 and S23 described with reference to FIG. 1.

According to the ball disposition system and the method for disposing the ball on the substrate in the embodiments of the inventive concepts, the guide member may be coupled to the adsorption plate in the state in which the guide member and the adsorption plate are in contact with each other. Thus, the ball may be adsorbed to the adsorption plate in the state in which the guide member is coupled to the adsorption plate. For example, the ball disposition process may be repeated in the state in which the guide member is coupled to the adsorption plate. Thus, an additional step for coupling of the guide member after attaching the ball may be omitted in subsequent ball disposition processes. As a result, a total process time may be reduced.

According to the ball disposition system and the method for disposing the ball on the substrate in the embodiments of the inventive concepts, the ball may be accurately placed on the substrate.

According to the ball disposition system and the method for disposing the ball on the substrate in the embodiments of the inventive concepts, it is possible to prevent the ball adsorption device from being contaminated when the ball is placed.

According to the ball disposition system and the method for disposing the ball on the substrate in the embodiments of the inventive concepts, the component, e.g., the guide unit 3 or the ball guide plate, may be easily replaced and/or cleaned when the component is contaminated.

According to the ball disposition system and the method for disposing the ball on the substrate in the embodiments of the inventive concepts, the ball may be guided to be placed on the center of the pad of the substrate by dropping the ball straight when the ball is dropped from the ball adsorption device to the substrate.

A method of manufacturing a semiconductor device according to an embodiment of the present disclosure, may include a method of disposing the ball on the substrate described above by using a ball disposition system described above. For example, the substrate on which the balls are disposed may receive a semiconductor chip on the balls so that the balls electrically connect the semiconductor chip with the substrate. Subsequent processes may be performed on the substrate and the semiconductor chip received on the substrate, e.g., a molding process and/or attaching terminal pins and/or connecting wires, to form a semiconductor package. For example, the semiconductor chip may be a memory chip, a logic chip, a chip including memory cells and logic circuits, etc.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A ball disposition system comprising:
   a ball adsorption device including an adsorption plate providing an adsorption hole extending in a first direction and a pin extending in the first direction, a portion of the pin inserted in the adsorption hole;
   a ball guide plate coupled to the ball adsorption device, the ball guide plate providing a ball guide hole;
   a stage configured to receive a substrate; and
   an inspection sensor block configured to measure a horizontality of the adsorption plate or a substrate on the stage, the inspection sensor block positioned between the ball adsorption device and the stage aligned with each other in the first direction,
   wherein the ball guide plate is located beyond the adsorption plate in the first direction.

2. The ball disposition system of claim 1, further comprising:
   a support connecting the ball guide plate to the adsorption plate,
   wherein the support extends in the first direction and is arranged for the ball guide plate to be spaced apart from the adsorption plate in the first direction.

3. The ball disposition system of claim 2, wherein the ball adsorption device further comprises a coupler,
   wherein the coupler includes a coupling magnet, and
   wherein the support includes a corresponding magnet corresponding to the coupling magnet.

4. The ball disposition system of claim 1, wherein an outer surface of the ball guide plate is in contact with an outer surface of the adsorption plate that faces the outer surface of the ball guide plate, and
   wherein the adsorption hole and the ball guide hole are connected to each other.

5. The ball disposition system of claim 1, wherein the ball guide hole is located on an extension line of the adsorption hole and extends in the first direction.

6. The ball disposition system of claim 1, wherein the adsorption hole includes an expanded adsorption hole of which diameter increases along the first direction and toward a surface of the adsorption plate.

7. The ball disposition system of claim 1, wherein the ball adsorption device further comprises:
   a pin hold plate to which the pin is attached, and
   wherein the pin hold plate is disposed to have a surface facing a surface of the adsorption plate and is movable in the first direction.

8. The ball disposition system of claim 7, wherein the ball adsorption device further comprises:
   a shaft extending in the first direction and connected to the pin hold plate; and
   a shaft driver, and
   wherein the shaft driver is configured to move the shaft in the first direction.

9. A ball disposition system comprising:
   a ball adsorption device configured to adsorb a ball, the ball adsorption device including an adsorption plate providing an adsorption hole to which the ball is adsorbed;
   a stage configured to receive a substrate;
   a ball guide coupled to the ball adsorption device, the ball guide comprises a ball guide plate providing a ball guide hole configured to guide a dropping path of a ball; and
   an inspection sensor block configured to measure a horizontality of the adsorption plate or a substrate on the stage, the inspection sensor block positioned between the ball adsorption device and the stage aligned with each other in a vertical direction,
   wherein the ball guide plate is configured to be disposed between the adsorption plate and the stage.

10. The ball disposition system of claim 9, wherein the ball adsorption device further comprises:
    a pin configured to push a ball adsorbed to the adsorption hole; and
    a pin hold plate to which the pin is attached, and
    wherein the pin hold plate is disposed on an opposite side of the adsorption plate as the ball guide plate, and is movable toward the adsorption plate.

11. The ball disposition system of claim 10, wherein the ball adsorption device further comprises an intermediate plate located between the pin hold plate and the adsorption plate, and
    wherein the intermediate plate provides an intermediate hole through which the pin passes.

12. The ball disposition system of claim 9, wherein the adsorption hole includes an expanded adsorption hole of which diameter increases progressively toward an end of the expanded adsorption hole, and
    wherein the adsorption plate and the expanded adsorption hole are configured such that a ball is adsorbed to the adsorption plate in a state in which the ball is in contact with an inner surface of the expanded adsorption hole.

13. The ball disposition system of claim 12, wherein a diameter of the ball guide hole is equal to or greater than a maximum value of the diameter of the expanded adsorption hole.

14. The ball disposition system of claim 9, wherein the ball guide further comprises a support coupled to the ball guide plate, and
    wherein the support holds the ball guide plate at a position spaced apart from the stage.

15. The ball disposition system of claim 14, wherein the support is connected to the stage.

16. A method for disposing a ball on a substrate, the method comprising:

adsorbing a ball to a ball adsorption device, the ball adsorption device including an adsorption plate providing an adsorption hole to which the ball is adsorbed;

coupling the ball adsorption device to a ball guide plate;

disposing the ball adsorption device coupled to the ball guide plate above the substrate;

aligning the ball adsorption device and the substrate with each other in a vertical direction;

measuring a horizontality of the ball guide plate or the substrate by a sensor disposed between the ball guide plate and the substrate aligned with each other in the vertical direction; and disposing the ball on the substrate, wherein the substrate is disposed on a stage, wherein the ball guide plate provides a ball guide hole for guiding a dropping path of the ball, and wherein the ball guide plate is disposed between the adsorption plate and the stage.

17. The method of claim 16, wherein the ball guide plate is coupled to the ball adsorption device through a support.

18. The method of claim 16, wherein the adsorbing of the ball to the ball adsorption device comprises:

turning the ball adsorption device over so that the adsorption hole faces upward;

providing vacuum pressure to the adsorption hole;

adsorbing the ball to the adsorption hole; and turning the ball adsorption device over again so that the adsorption hole faces downward, wherein the adsorbing of the ball to the adsorption hole comprises dropping the ball by a ball supplier to supply the ball on the adsorption plate.

* * * * *